US012690185B2

(12) United States Patent
Wang et al.

(10) Patent No.: US 12,690,185 B2
(45) Date of Patent: Jul. 21, 2026

(54) DYNAMIC FLASH MEMORY (DFM) WITH CHANNEL FIRST SCHEME

(71) Applicant: Yangtze Memory Technologies Co., Ltd., Wuhan (CN)

(72) Inventors: Di Wang, Wuhan (CN); Lei Liu, Wuhan (CN); Yuancheng Yang, Wuhan (CN); Wenxi Zhou, Wuhan (CN); Kun Zhang, Wuhan (CN); Tao Yang, Wuhan (CN); Dongxue Zhao, Wuhan (CN); Zhiliang Xia, Wuhan (CN); Zongliang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 660 days.

(21) Appl. No.: 17/731,523

(22) Filed: Apr. 28, 2022

(65) Prior Publication Data

US 2023/0354578 A1 Nov. 2, 2023

(51) Int. Cl.
 H01L 27/108 (2006.01)
 H10B 12/00 (2023.01)
 H10D 30/67 (2025.01)

(52) U.S. Cl.
 CPC ............. H10B 12/20 (2023.02); H10B 12/05 (2023.02); H10D 30/6728 (2025.01)

(58) Field of Classification Search
 CPC .............................................. H10B 12/00–50
 See application file for complete search history.

(56) References Cited

U.S. PATENT DOCUMENTS

| | | | | |
|---|---|---|---|---|
| 5,874,760 A | * | 2/1999 | Burns, Jr. .......... | H10D 30/6891 257/E21.652 |
| 5,929,477 A | * | 7/1999 | McAllister Burns, Jr. .................. | H10B 41/00 438/386 |
| 5,994,735 A | * | 11/1999 | Maeda ................. | H10B 12/395 257/302 |

(Continued)

FOREIGN PATENT DOCUMENTS

WO WO-2017175955 A1 * 10/2017 .......... H10D 12/212

OTHER PUBLICATIONS

Machine translation, Kim, WIPO Pat. Pub. No. WO-2017175955-A1, translation date: Feb. 28, 2026, Espacenet, all pages. (Year: 2026).*

(Continued)

*Primary Examiner* — Victoria K. Hall
(74) *Attorney, Agent, or Firm* — Conley Rose, P.C

(57) ABSTRACT

A three-dimensional (3D) memory device includes a memory cell, a top contact coupled to the memory cell, and a bottom contact coupled to the memory cell. The memory cell can include a pillar, an insulating layer surrounding the pillar, a first gate contact surrounding a first portion of the insulating layer, and a second gate contact surrounding a second portion of the insulating layer. The pillar can be configured to store an electrical charge. The pillar can be a monocrystalline material. The 3D memory device can utilize dynamic flash memory (DFM), decrease defects, increase manufacturing efficiency, decrease leakage current, decrease junction current, decrease power consumption, increase storage density, increase charge retention times, and decrease refresh rates.

12 Claims, 16 Drawing Sheets

(56) References Cited

U.S. PATENT DOCUMENTS

| | | | | |
|---|---|---|---|---|
| 6,013,548 A * | 1/2000 | Burns, Jr. | ............ | H10B 12/053 |
| | | | | 438/242 |
| 10,867,678 B2 | 12/2020 | Chen et al. | | |
| 12,262,533 B2 * | 3/2025 | Yang | ....................... | H10B 43/27 |
| 2002/0167837 A1 * | 11/2002 | Jain | ........................... | G11C 8/16 |
| | | | | 257/E21.654 |
| 2010/0213525 A1 * | 8/2010 | Masuoka | ............. | H10D 84/038 |
| | | | | 257/329 |
| 2018/0061836 A1 * | 3/2018 | Mathew | ............... | H10B 12/395 |
| 2020/0044095 A1 * | 2/2020 | Wang | ................... | H10D 86/421 |
| 2021/0193661 A1 * | 6/2021 | Lee | ........................ | H10B 12/00 |
| 2021/0375874 A1 * | 12/2021 | Doornbos | ............ | H10N 70/011 |
| 2022/0208254 A1 * | 6/2022 | Sakui | .................... | G11C 11/406 |
| 2022/0399355 A1 * | 12/2022 | Tsuda | .................... | G11C 11/405 |
| 2023/0069096 A1 * | 3/2023 | Yang | ..................... | H10W 90/00 |
| 2023/0097904 A1 * | 3/2023 | Ando | ..................... | G11C 16/10 |
| 2023/0225105 A1 * | 7/2023 | Shirota | .................. | H10B 12/20 |
| | | | | 257/314 |
| 2023/0354577 A1 * | 11/2023 | Zhao | ...................... | H10B 43/27 |

OTHER PUBLICATIONS

Koji Sakui and Nozomu Harada, "Dynamic Flash Memory with Dual Gate Surrounding Gate Transistor (SGT)," 2021 IEEE International Memory Workshop (IMW), May 16, 2021, DOI: 10.1109/IMW51353.2021.9439614, 4 pages.
"Unisantis unveils Dynamic Flash Memory as DRAM alternative: Benefits in higher density, speed and cost savings," Unisantis Electronics, May 19, 2021, https://unisantis.com/wp-content/uploads/2021/05/Unisantis_DFM.pdf, 3 pages.

* cited by examiner

500A
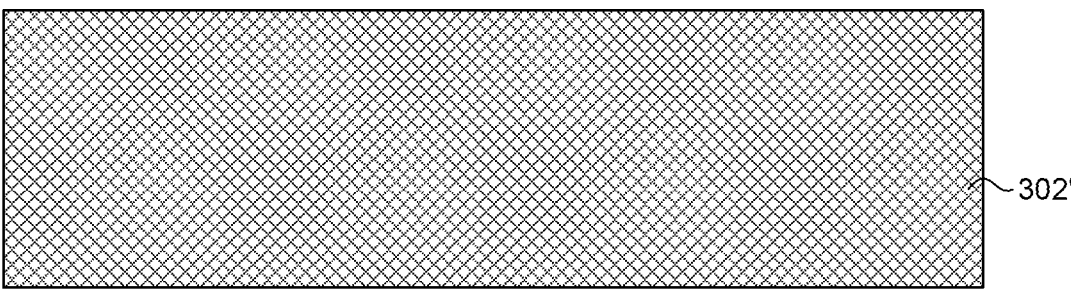
302'
FIG. 5A
500
500B
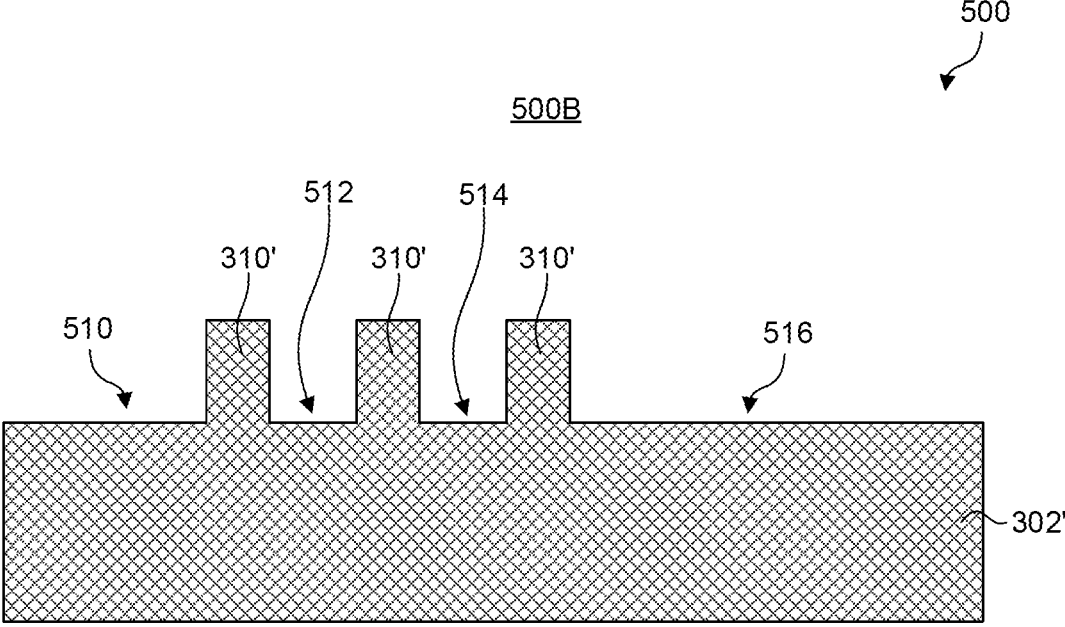
512     514
310'    310'    310'
510                     516
302'
FIG. 5B

500

500C

520

302'

310'    310'    310'

500

500D

522

520

302'

310'    310'    310'

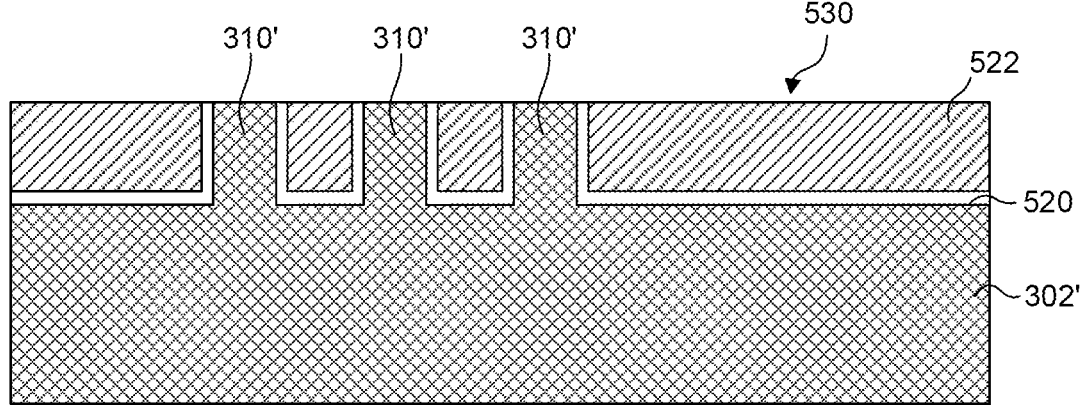
FIG. 5E
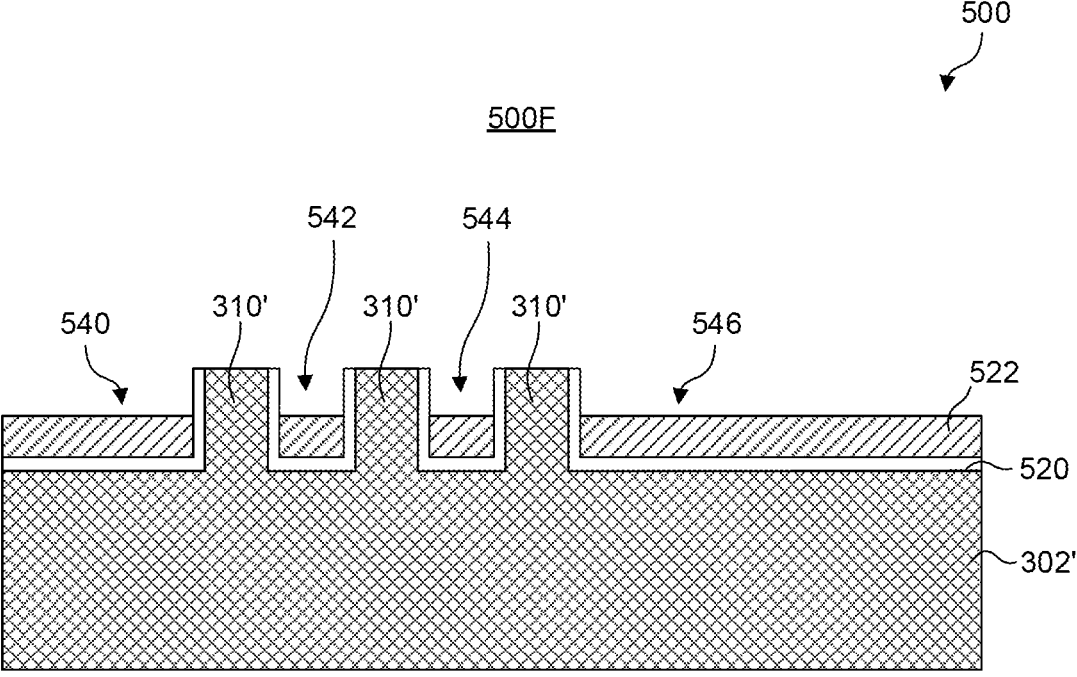
FIG. 5F

500

500G

500

500H

500'

700C

500'

700D

500'

700E

500'

700F

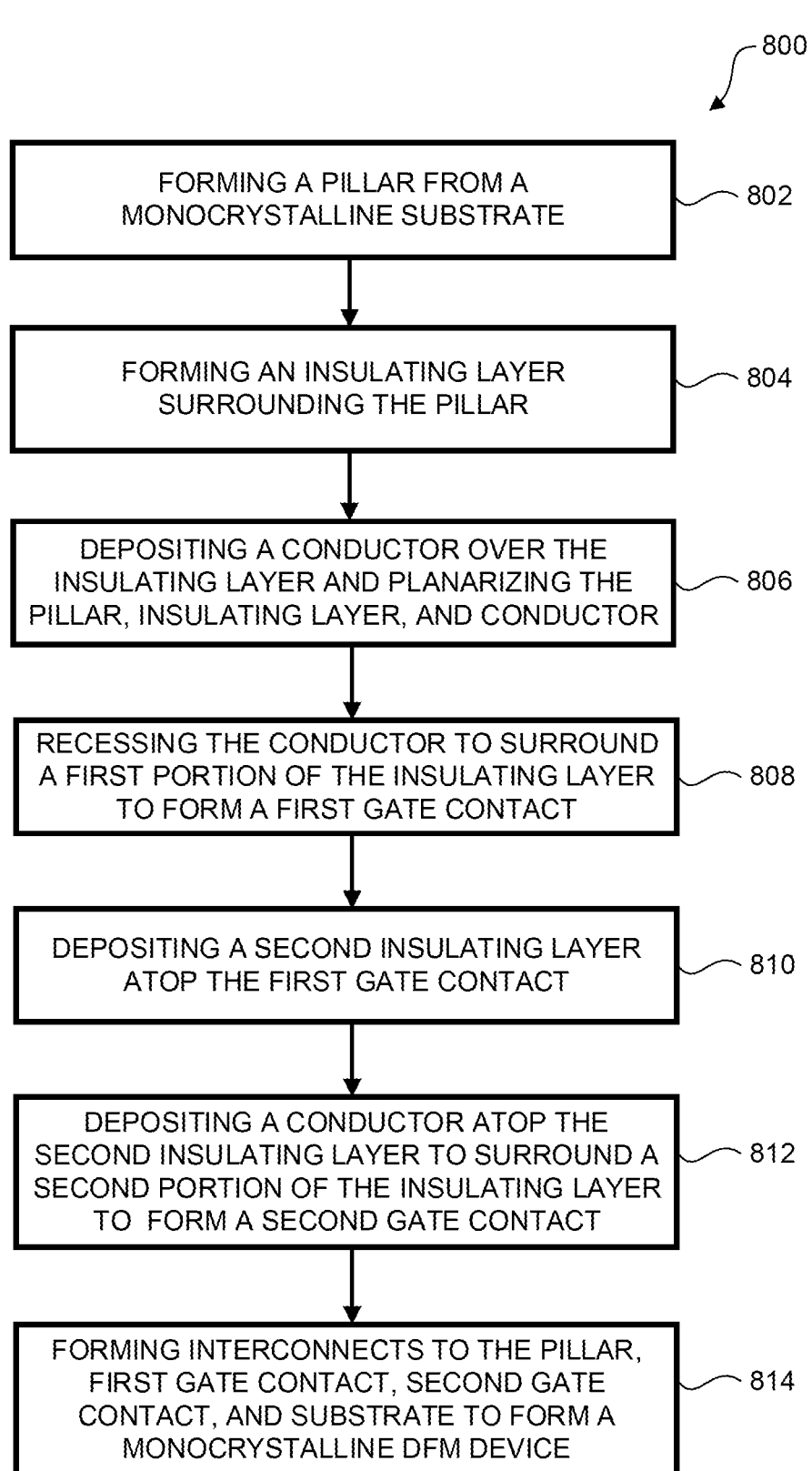

800

FORMING A PILLAR FROM A
MONOCRYSTALLINE SUBSTRATE
802

FORMING AN INSULATING LAYER
SURROUNDING THE PILLAR
804

DEPOSITING A CONDUCTOR OVER THE
INSULATING LAYER AND PLANARIZING THE
PILLAR, INSULATING LAYER, AND CONDUCTOR
806

RECESSING THE CONDUCTOR TO SURROUND
A FIRST PORTION OF THE INSULATING LAYER
TO FORM A FIRST GATE CONTACT
808

DEPOSITING A SECOND INSULATING LAYER
ATOP THE FIRST GATE CONTACT
810

DEPOSITING A CONDUCTOR ATOP THE
SECOND INSULATING LAYER TO SURROUND A
SECOND PORTION OF THE INSULATING LAYER
TO  FORM A SECOND GATE CONTACT
812

FORMING INTERCONNECTS TO THE PILLAR,
FIRST GATE CONTACT, SECOND GATE
CONTACT, AND SUBSTRATE TO FORM A
MONOCRYSTALLINE DFM DEVICE
814

FIG. 8

DYNAMIC FLASH MEMORY (DFM) WITH CHANNEL FIRST SCHEME

BACKGROUND

Field

The present disclosure relates to dynamic flash memory (DFM) apparatuses, systems, and methods, for example, monocrystalline DFM apparatuses, systems, and methods to decrease defects in a three-dimensional (3D) memory device.

Background

Dynamic random-access memory (DRAM) is a volatile memory that uses charge stored on a capacitor to represent information. DRAM stores each bit in a memory cell that includes a transistor and a capacitor (e.g., 1T1C). Charge levels greater than a certain threshold can represent a first logic level (e.g., 1 state) and charge levels less than another threshold amount can represent a second logic level (e.g., 0 state). Leakage currents and various parasitic effects limit the length of time a capacitor can hold charge and regular refresh cycles are needed. DRAM retention times can be as low as 32 ms during high temperature operations (e.g., above 85° C.) and can require refresh rates of about 31 Hz.

Flash memory (flash) is a non-volatile memory that uses charge stored on a floating gate to represent information. Flash stores each bit in a memory cell that includes a transistor with a floating gate. The amount of charge on the floating gate will determine whether the transistor will conduct when a fixed set of read bias conditions are applied. Flash can retain charge for a long period of time (e.g., about 10 years at 85° C.) since the floating gate is completely surrounded by insulators. Further, the act of reading the data can be performed non-destructively without loss of the information. In addition, flash can quickly erase entire blocks or pages of data simultaneously (e.g., NAND flash).

Current 1T1C DRAM is approaching a process limit. The manufacturing of 1T1C DRAM devices with small-node capacitors to retain charge is becoming more difficult due to increased current leakage, increased power consumption, degraded operating voltage margins, and decreased retention times. Further, current single transistor (1T) capacitor-free DRAM (e.g., ZRAM, TTRAM, ARAM, etc.) devices need further improvement and optimization for manufacturable integration and operation solutions.

SUMMARY

Accordingly, there is a need to, e.g., provide a capacitor-free monocrystalline dynamic random-access memory device. Further, there is a need to decrease manufacturing defects and increase manufacturing efficiency. Further, there is a need to decrease leakage current, decrease junction current, and decrease power consumption. Further, there is a need to increase charge retention times and decrease refresh rates.

In some aspects, a three-dimensional (3D) memory device can include a memory cell, a top contact coupled to the memory cell, and a bottom contact coupled to the memory cell. In some aspects, the 3D memory device can decrease defects, increase manufacturing efficiency, decrease leakage current, decrease junction current, decrease power consumption, increase charge retention times, and/or decrease refresh rates.

In some aspects, the memory cell can include a pillar, an insulating layer, a first gate contact, and a second gate contact. In some aspects, the pillar can be configured to store an electrical charge. In some aspects, the pillar can be a monocrystalline material. In some aspects, the insulating layer can surround the pillar. In some aspects, the first gate contact can surround a first portion of the insulating layer. In some aspects, the first gate contact can be coupled to a word line configured to address and non-destructively read the pillar. In some aspects, the second gate contact can surround a second portion of the insulating layer. In some aspects, the second gate contact can be coupled to a plate line configured to program the pillar.

In some aspects, the top contact can be coupled to a bit line configured to flow electrical charge through and/or away from the memory cell. In some aspects, the bottom contact coupled to a source line configured to flow electrical charge through and/or away from the memory cell. In some aspects, different voltage combinations can be applied to the bit line, the word line, the plate line, and the source line to perform read (e.g., non-destructively), program (e.g., 1 state), and erase (e.g., 0 state) operations on the 3D memory device.

In some aspects, the pillar can be a monolithic vertical pillar. In some aspects, the monolithic vertical pillar can be a single semiconductor material (e.g., silicon, doped silicon, monocrystalline silicon, etc.). In some aspects, the monolithic vertical pillar can decrease defect concentrations, increase charge conduction, decrease leakage current, and increase manufacturing efficiency.

In some aspects, the monocrystalline material can be configured to decrease a defect concentration in the pillar. In some aspects, the defect concentration can be no greater than about $1 \times 10^{11}$ cm$^2$.

In some aspects, the monocrystalline material can be configured to decrease a leakage current in the pillar. In some aspects, the leakage current can be no greater than about 1 pA.

In some aspects, a retention time of storing the electrical charge in the pillar can be greater than about 100 ms. In some aspects, the retention time can be greater than about 100 ms for an operating temperature of at least about 85° C.

In some aspects, the monocrystalline material can include silicon (Si), germanium (Ge), silicon-germanium (SiGe), gallium arsenide (GaAs), gallium phosphide (GaP), gallium antimonide (GaSb), indium arsenide (InAs), indium antimonide (InSb), cadmium sulfide (CdS), cadmium selenide (CdSe), cadmium telluride (CdTe), zinc sulfide (ZnS), zinc selenide (ZnSe), zinc telluride (ZnTe), graphene, sapphire, a Group IV semiconductor, a Group III-V semiconductor, a Group II-VI semiconductor, or any other single crystal material.

In some aspects, the insulating layer can be a monolithic insulating layer. In some aspects, the monolithic insulating layer can be a single dielectric material (e.g., high-k dielectric, oxide, nitride, silicon oxide, silicon nitride, glass, spin-on-glass (SOG), etc.). In some aspects, the monolithic insulating layer can decrease defect concentrations, increase gate capacitance, decrease leakage current, and increase manufacturing efficiency.

In some aspects, in a first logic state (e.g., 1 state), the pillar of the memory cell can include the electrical charge. In some aspects, different voltage combinations can be applied to the bit line, the word line, the plate line, and the source line to perform a program (e.g., 1 state) operation on the memory cell to store the electrical charge on the pillar.

In some aspects, in a second logic state (e.g., 0 state), the pillar of the memory cell can include substantially no electrical charge. In some aspects, different voltage combinations can be applied to the bit line, the word line, the plate line, and the source line to perform an erase (e.g., 0 state) operation on the memory cell to remove the electrical charge on the pillar.

In some aspects, the 3D memory device can perform a block erase operation. In some aspects, different voltage combinations can be applied to the bit line, the word line, the plate line, and the source line to perform a block erase (e.g., 0 state) operation on a plurality of 3D memory devices in a memory block simultaneously.

In some aspects, the 3D memory device can perform a refresh operation. In some aspects, different voltage combinations can be applied to the bit line, the word line, the plate line, and the source line to perform a refresh (e.g., "0 state" refresh, "1 state" refresh) operation on the memory cell.

In some aspects, the 3D memory device can perform a block refresh operation. In some aspects, different voltage combinations can be applied to the bit line, the word line, the plate line, and the source line to perform a block refresh (e.g., "0 state" refresh, "1 state" refresh) operation on a plurality of 3D memory devices in a memory block simultaneously.

In some aspects, the 3D memory device can have a charge retention time of at least 100 ms. In some aspects, the 3D memory device can have a charge retention time of at least 100 ms during high temperature operation (e.g., greater than 85° C.).

In some aspects, the 3D memory device can have a refresh rate of no greater than 10 Hz. In some aspects, the 3D memory device can have a refresh rate of no greater than 10 Hz during high temperature operation (e.g., greater than 85° C.).

In some aspects, the 3D memory device can include a dynamic flash memory (DFM) device. In some aspects, the top contact, the memory cell, and the bottom contact can form a DFM device. In some aspects, the DFM device can decrease defects, increase manufacturing efficiency, decrease leakage current, decrease junction current, decrease power consumption, increase charge retention times, and decrease refresh rates.

In some aspects, the 3D memory device comprises a NAND DFM device. In some aspects, the 3D memory device can include floating-gate transistors (e.g., memory strings) connected in series that resemble a NAND gate.

In some aspects, the top contact can be n-type (e.g., n+), the memory cell can be p-type (e.g., p), and the bottom contact can be n-type (e.g., n+) so that the 3D memory device forms p-type surrounding gate transistors (SGTs) with hole charge carriers. In some aspects, when activated (e.g., source line voltage applied) hole carriers flow through the memory cell from the bottom contact (e.g., source) to the top contact (e.g., drain).

In some aspects, a method for forming a three-dimensional (3D) memory device can include forming a pillar from a monocrystalline substrate. In some aspects, the method can further include forming an insulating layer surrounding the pillar. In some aspects, the method can further include forming a first gate contact surrounding a first portion of the insulating layer. In some aspects, the method can further include forming a second gate contact surrounding a second portion of the insulating layer. In some aspects, the method can further include forming interconnects to the pillar, the first gate contact, the second gate contact, and the substrate.

In some aspects, the forming the pillar can include etching the monocrystalline substrate to form a plurality of channel trenches. In some aspects, the substrate can be a monocrystalline material (e.g., silicon, germanium, Group IV semiconductor, Group III-V semiconductor, Group II-VI semiconductor, graphene, sapphire, etc.).

In some aspects, the insulating layer can include a high-k dielectric, an oxide, a nitride, or a combination thereof.

In some aspects, the forming the first gate contact can include depositing polysilicon, tungsten, aluminum, a metal, or any other conductive material. In some aspects, the forming the first gate contact can include planarizing the pillar, the insulating layer, and the first gate contact. In some aspects, the forming the first gate contact can include recessing the first gate contact relative to the pillar and the insulating layer.

In some aspects, the forming the second gate contact can include depositing polysilicon, tungsten, aluminum, a metal, or any other conductive material.

In some aspects, the forming interconnects can include coupling the first gate contact to a plate line configured to program the pillar, coupling the second gate contact to a word line configured to address and non-destructively read the pillar, coupling the pillar to a bit line configured to flow electrical charge through and/or away from the pillar, and coupling the substrate to a source line configure to flow electrical charge through and/or away from the pillar.

In some aspects, the method can include forming a DFM device. In some aspects, forming the pillar, the insulating layer, the first gate contact, and the second gate contact can form a DFM device. In some aspects, the formed DFM device can decrease defects, increase manufacturing efficiency, decrease leakage current, decrease junction current, decrease power consumption, increase charge retention times, and decrease refresh rates.

In some aspects, the method can include forming a NAND DFM device. In some aspects, forming the NAND DFM device can include forming floating-gate transistors (e.g., memory strings) connected in series that resemble a NAND gate.

In some aspects, a method for forming a three-dimensional (3D) memory device can include forming a pillar from a monocrystalline substrate. In some aspects, the method can further include forming an insulating layer surrounding the pillar. In some aspects, the method can further include forming a second insulating layer surrounding a first portion of the insulating layer. In some aspects, the method can further include forming a third insulating layer surrounding a second portion of the insulating layer. In some aspects, the method can further include removing the second insulating layer and the third insulating layer. In some aspects, the method can further include forming a first gate contact surrounding the first portion of the insulating layer in the removed second insulating layer and a second gate contact surrounding the second portion of the insulating layer in the removed third insulating layer. In some aspects, the method can further include forming interconnects to the pillar, the first gate contact, the second gate contact, and the substrate.

In some aspects, the forming the pillar can include etching the monocrystalline substrate to form a plurality of channel trenches. In some aspects, the substrate can be a monocrystalline material (e.g., silicon, germanium, Group IV semiconductor, Group III-V semiconductor, Group II-VI semiconductor, graphene, sapphire, etc.).

In some aspects, the insulating layer can include a high-k dielectric, an oxide, a nitride, or a combination thereof.

In some aspects, the forming the second insulating layer can include depositing an oxide, a nitride, or a combination thereof. In some aspects, the forming the second insulating layer can include planarizing the pillar, the insulating layer, and the second insulating layer. In some aspects, the forming the second insulating layer can include recessing the second insulating layer relative to the pillar and the insulating layer.

In some aspects, the removing the second insulating layer and the third insulating layer can include isotropically etching from a lateral edge of the 3D memory device.

In some aspects, the forming the first gate contact and the second gate contact can include depositing polysilicon, tungsten, aluminum, a metal, or any other conductive material.

In some aspects, the forming interconnects can include coupling the first gate contact to a plate line configured to program the pillar, coupling the second gate contact to a word line configured to address and non-destructively read the pillar, coupling the pillar to a bit line configured to flow electrical charge through and/or away from the pillar, and coupling the substrate to a source line configure to flow electrical charge through and/or away from the pillar.

In some aspects, the method can include forming a DFM device. In some aspects, forming the pillar, the insulating layer, the first gate contact, and the second gate contact can form a DFM device. In some aspects, the formed DFM device can decrease defects, increase manufacturing efficiency, decrease leakage current, decrease junction current, decrease power consumption, increase charge retention times, and decrease refresh rates.

Implementations of any of the techniques described above may include a system, a method, a process, a device, and/or an apparatus. The details of one or more implementations are set forth in the accompanying drawings and the description below. Other features will be apparent from the description and drawings, and from the claims.

Further features and exemplary aspects of the aspects, as well as the structure and operation of various aspects, are described in detail below with reference to the accompanying drawings. It is noted that the aspects are not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the aspects and, together with the description, further serve to explain the principles of the aspects and to enable a person skilled in the relevant art(s) to make and use the aspects.

FIGS. 5A through 5J illustrate a manufacturing method for forming the monocrystalline DFM array shown in FIG. 4, according to exemplary aspects.

FIG. 8 illustrates a flow diagram for forming the monocrystalline DFM device shown in FIG. 4, according to an exemplary aspect.

Figure 1:
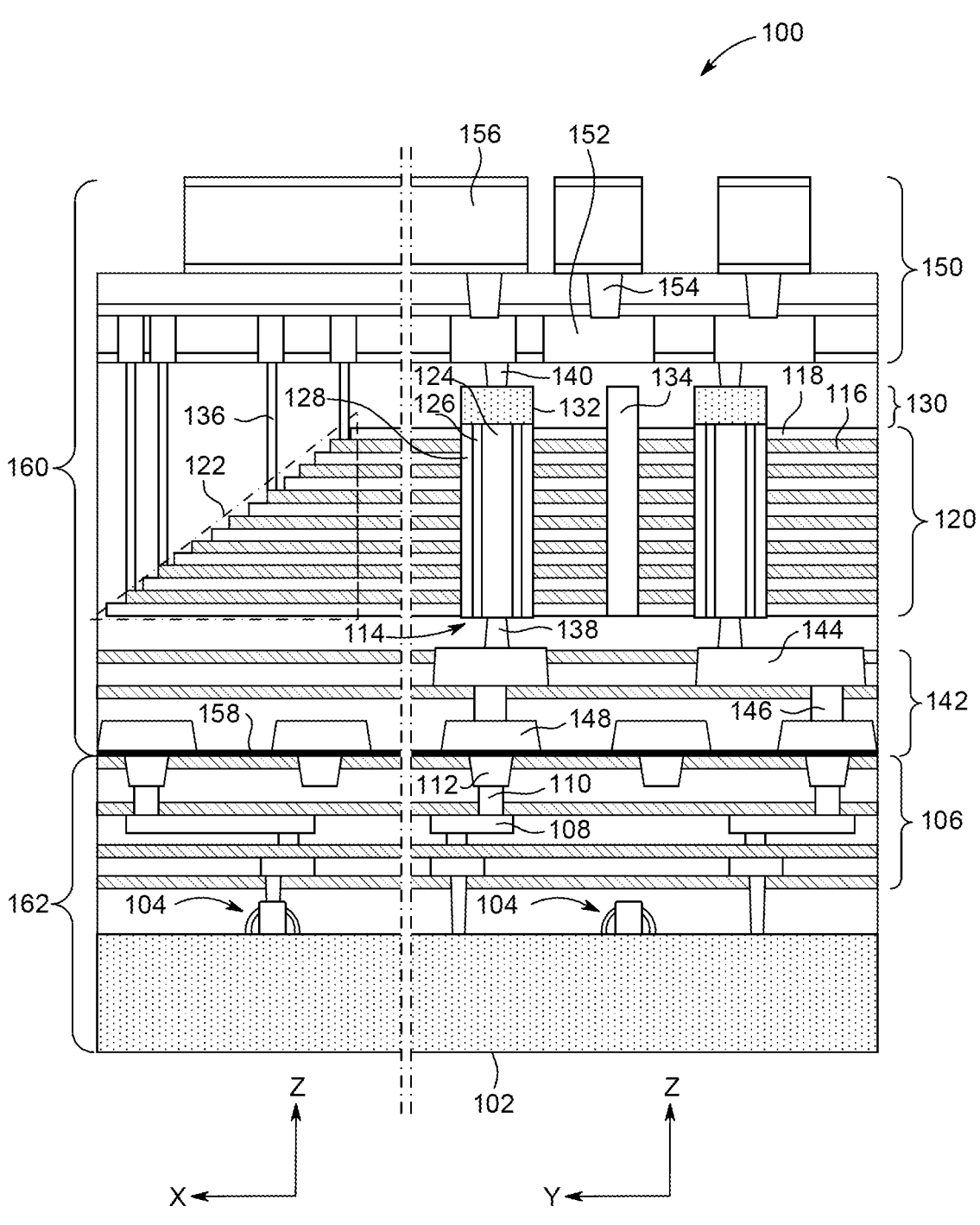
FIG. 1 is a schematic cross-sectional illustration of a 3D memory device, according to an exemplary aspect.

The features and exemplary aspects of the aspects will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more aspects that incorporate the features of this present invention. The disclosed aspect(s) merely exemplify the present invention. The scope of the invention is not limited to the disclosed aspect(s). The present invention is defined by the claims appended hereto.

The aspect(s) described, and references in the specification to "one aspect," "an aspect," "an example aspect," "an exemplary aspect," etc., indicate that the aspect(s) described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is understood that it is within the knowledge of one skilled in the art to effect such feature, structure, or characteristic in connection with other aspects whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" or "substantially" or "approximately" as used herein indicates the value of a given quantity that can vary based on a particular technology. Based on the particular technology, the term "about" or "substantially" or "approximately" can indicate a value of a given quantity that varies within, for example, 1-15% of the value (e.g., ±1%, ±2%, ±5%, ±10%, or ±15% of the value).

The term "dynamic random-access memory" or "DRAM" as used herein indicates a volatile memory that uses charge stored on a capacitor to represent information. DRAM stores each bit in a memory cell that includes a transistor and a capacitor (e.g., 1T1C). The 1T1C design can be based on metal-oxide-semiconductor (MOS) technology. Charge levels greater than a certain threshold can represent a first logic level (e.g., 1 state) and charge levels less than another threshold amount can represent a second logic level (e.g., 0 state). Leakage currents and various parasitic effects limit the length of time a capacitor can hold charge. Each time data is read, it must be rewritten to ensure retention and regular data refresh cycles must be performed. DRAM retention times can be as low as 32 ms during high temperature operations (e.g., greater than 85° C.) and can require refresh rates of about 31 Hz.

The term "flash memory" or "flash" as used herein indicates a non-volatile memory that uses charge stored on a floating gate to represent information. Flash stores each bit in a memory cell that includes a transistor with a floating gate. The amount of charge on the floating gate will determine whether the transistor will conduct when a fixed set of read bias conditions are applied. Flash can retain charge for a long period of time (e.g., about 10 years at 85° C.) since the floating gate is completely surrounded by insulators. Further, the act of reading the data can be performed non-destructively without loss of the information. In addition, flash can quickly erase data and entire blocks or pages of data can be erased simultaneously.

The term "NAND" as used herein indicates memory designs or architectures that resemble NAND logic gates (e.g., an inverted AND gate) and connect to memory cells in series (e.g., memory strings). In NAND flash, the relationship between a bit line and a word line resembles a NAND logic gate and can be used for fast writes and high-density arrays. NAND flash can access data sequentially since the transistors in the array are connected in series (e.g., memory strings). NAND flash can be read, programmed (written), and erased in blocks or pages. NAND flash can have a smaller cell size than DRAM but can require additional circuitry to implement.

The term "surrounding gate transistor" or "SGT" as used herein indicates a memory device that has a gate surrounding a channel region of a transistor on all sides.

The term "dynamic flash memory" or "DFM" as used herein indicates a volatile memory that uses a dual gate SGT. The dual gates of the dual gate SGT can include a word line (WL) gate and a plate line (PL) gate. DFM can be capacitor-free and can store charge on a channel region of a transistor. DFM can still requires a refresh cycle but can offer longer retention times, faster operation speeds, and higher density than compared to DRAM or other types of volatile memory. Further, similar to flash, DFM can offer block refresh and block erase operations.

The term "bit line" or "BL" as used herein indicates an array connection to address a particular memory cell in a memory array. A bit line can be connected to a drain of a transistor (e.g., DFM device). A bit line can be connected to two or more serially connected memory cells (e.g., memory strings). Different voltage combinations applied to the bit line can define read, program (write), and erase operations in the memory cell.

The term "source line" or "SL" as used herein indicates an array connection to address a particular memory cell in a memory array. A source line can be connected to a source of a transistor (e.g., DFM device). A source line can be connected to two or more serially connected memory cells (e.g., memory strings). Different voltage combinations applied to the source line can define read, program (write), and erase operations in the memory cell.

The term "word line" or "WL" as used herein indicates an array connection to provide a voltage to a particular memory cell in a memory array to select which row of bits is to be read, programmed, or erased. A word line can act as a top select gate (TSG). A word line can be connected to a portion of a channel or a portion of a body of a transistor (e.g., DFM device). Different voltage combinations applied to the word line can define read, program (write), and erase operations in the memory cell. When the word line is activated, current flows only if charge is already on the memory cell. If there is charge on the channel or body of the memory cell, the read operation recharges the memory cell and is non-destructive. If there is no charge on the channel or body of the memory cell, no current flows and the read is also non-destructive.

The term "plate line" or "PL" as used herein indicates an array connection to provide a voltage to a particular memory cell in a memory array to read, program, or erase charge on the memory cell. A plate line can be connected to a portion of a channel or a portion of a body of a transistor (e.g., DFM device). Different voltage combinations applied to the plate line can define read, program (write), and erase operations in the memory cell. When the plate line is activated, charge flows from the source line (source) to the bit line (drain). When the plate line is deactivated, any remaining charge is stored in the channel or body of the memory cell.

The term "substrate" as used herein indicates a planar wafer on which subsequent layers can be deposited, formed, or grown. A substrate can be formed of a single element (e.g., Si) or a compound material (e.g., GaAs), and may be doped or undoped. For example, a substrate can include silicon (Si), germanium (Ge), silicon-germanium (SiGe), gallium arsenide (GaAs), gallium nitride (GaN), gallium phosphide (GaP), gallium antimonide (GaSb), indium phosphide (InP), indium antimonide (InSb), a Group IV semiconductor, a Group III-V semiconductor, a Group II-VI semiconductor, graphene, sapphire, and/or any other semiconductor material. A substrate can be a monocrystalline material (e.g., monocrystalline Si).

The term "Group III-V semiconductor" as used herein indicates comprising one or more materials from Group III of the periodic table (e.g., group 13 elements: boron (B), aluminum (Al), gallium (Ga), indium (In), thallium (Tl)) with one or more materials from Group V of the periodic table (e.g., group 15 elements: nitrogen (N), phosphorus (P), arsenic (As), antimony (Sb), bismuth (Bi)). The compounds have a 1:1 combination of Group III and Group V regardless of the number of elements from each group. Subscripts in chemical symbols of compounds refer to the proportion of that element within that group. For example, $Al_{0.25}GaAs$ means the Group III part comprises 25% Al, and thus 75% Ga, while the Group V part comprises 100% As.

The term "Group IV semiconductor" as used herein indicates comprising two or more materials from Group IV of the periodic table (e.g., group 14 elements: carbon (C), silicon (Si), germanium (Ge), tin (Sn), lead (Pb)). Subscripts in chemical symbols of compounds refer to the proportion of that element. For example, $Si_{0.25}Ge_{0.75}$ means the Group IV part comprises 25% Si, and thus 75% Ge.

The term "Group II-VI semiconductor" as used herein indicates comprising one or more materials from Group II of the periodic table (e.g., group 12 elements: zinc (Zn), cadmium (Cd), mercury (Hg)) with one or more materials from Group VI of the periodic table (e.g., group 16 elements: oxygen (O), sulfur (S), selenium (Se), tellurium (Te)). The compounds have a 1:1 combination of Group II and Group VI regardless of the number of elements from each group. Subscripts in chemical symbols of compounds refer to the proportion of that element within that group.

The term "doping" or "doped" as used herein indicates that a layer or material contains a small impurity concentration of another element (dopant) which donates (donor) or extracts (acceptor) charge carriers from the parent material and therefore alters the conductivity. Charge carriers may be electrons or holes. A doped material with extra electrons is called n-type while a doped material with extra holes (fewer electrons) is called p-type.

The term "crystalline" as used herein indicates a material or layer with a single crystal orientation. In epitaxial growth or deposition, subsequent layers with the same or similar lattice constant follow the registry of the previous crystalline layer and therefore grow with the same crystal orientation or crystallinity.

The term "monocrystalline" as used herein indicates a material or layer having a continuous crystal lattice throughout the material or layer. Monocrystalline can indicate a single crystal or monocrystal (e.g., Si, Ge, GaAs, etc.).

The term "monolithic" as used herein indicates a layer, element, or substrate comprising bulk (e.g., single) material throughout. A monolithic element (e.g., a pillar) can be formed from a single bulk material (e.g., Si).

The term "deposit" or "deposition" as used herein indicates the depositing or growth of a layer on another layer or substrate. Deposition can encompass vacuum deposition, thermal evaporation, arc vaporization, ion beam deposition, e-beam deposition, sputtering, laser ablation, pulsed laser deposition (PLD), physical vapor deposition (PVD), atomic layer deposition (ALD), chemical vapor deposition (CVD), plasma-enhanced CVD (PECVD), low pressure CVD (LPCVD), metal-organic chemical vapor deposition (MOCVD), liquid source misted chemical deposition, spin-coating, epitaxy, vapor-phase epitaxy (VPE), liquid-phase epitaxy (LPE), solid-phase epitaxy (SPE), MBE, atomic layer epitaxy (ALE), molecular-beam epitaxy (MBE), powder bed deposition, and/or other known techniques to deposit material in a layer.

The term "dielectric" as used herein indicates an electrically insulating layer. Dielectric can encompass oxide, nitride, oxynitride, ceramic, glass, spin-on-glass (SOG), polymer, plastic, thermoplastic, resin, laminate, high-k dielectric, and/or any other electrically insulating material.

The term "high-k dielectric" as used herein indicates a material with a high dielectric constant k or κ (kappa), for example, relative to the dielectric constant of silicon dioxide ($SiO_2$). High-k dielectrics can be used as a gate dielectric or as another dielectric layer in an electronic device.

The term "high-k metal gate" or "high-k dielectric and conductive gate" or "HKMG" as used herein indicates a process of forming a high-k dielectric layer and a conductive (metal) layer stack in a memory device. HKMG technology can reduce gate leakage, increase transistor capacitance, and provide low power consumption for devices. Two process flows to pattern the HKMG stack are gate-first and gate-last.

The term "epitaxy" or "epitaxial" or "epitaxially" as used herein indicates crystalline growth of material, for example, via high temperature deposition.

The term "selective epitaxial growth" or "SEG" as used herein indicates local growth of an epitaxial layer through a pattern mask on a substrate or a layer. SEG provides epitaxial growth only on the exposed substrate or layer and other regions are masked by a dielectric film or other material that is not reactive to epitaxy.

The term "alternating dielectric stack" as used herein indicates a stack of different alternating dielectric layers in succession. For example, the first dielectric layer can be an oxide (e.g., silicon oxide) and the second dielectric layer can be a nitride (e.g., silicon nitride). The alternating dielectric stack can be arranged in a staircase pattern.

The term "gate line trench" as used herein indicates a trench or hole extending through an alternating dielectric stack of a memory device. The gate line trench can be used to form a gate line slit in the memory device.

The term "gate line slit" or "GLS" as used herein indicates a conductive pathway through an alternating dielectric stack, for example, between adjacent memory blocks or adjacent memory cells. The GLS can provide connection to a HKMG stack in a memory device. The GLS can extend vertically through the alternating dielectric stack and extend horizontally between two adjacent arrays of memory blocks or memory cells.

Aspects of the disclosure may be implemented in hardware, firmware, software, or any combination thereof. Aspects of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; dynamic flash memory (DFM) devices, electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such aspects in more detail, however, it is instructive to present example environments in which aspects of the present disclosure may be implemented.

Exemplary 3D Memory Device

FIG. 1 is a schematic cross-sectional illustration of 3D memory device 100, according to an exemplary aspect. 3D memory device 100 can be configured to increase storage density and incorporate a memory array and peripheral devices for controlling signals to and from the memory array. Although 3D memory device 100 is shown in FIG. 1 as a stand-alone apparatus and/or system, the aspects of this disclosure can be used with other apparatuses, systems, and/or methods, such as, but not limited to, dual gate SGT device 200, DFM device 300, monocrystalline DFM device 300', monocrystalline DFM device 300", DFM array 400, DFM array 400', manufacturing method 500, manufacturing method 500', flow diagram 800, and/or flow diagram 900.

As shown in FIG. 1, 3D memory device 100 can include substrate 102, memory array 160, and peripheral device 162. Memory array 160 can include memory stack 120, semiconductor layer 130, array interconnect layer 142, and back-end-of-line (BEOL) interconnect layer 150. Peripheral device 162 can include substrate 102, plurality of transistors 104, and interconnect layer 106. 3D memory device 100 represents an example of a non-monolithic 3D memory device, in which components of the 3D memory device 100 (e.g., peripheral devices and memory arrays) can be formed separately on different substrates and then joined to from 3D memory device 100. This is described in further detail in U.S. Pat. No. 10,867,678, which is incorporated by reference herein in its entirety.

3D memory device 100 can include substrate 102, for example, silicon (e.g., single crystalline silicon), silicon-germanium (SiGe), gallium arsenide (GaAs), germanium (Ge), silicon on insulator (SOI), or any other suitable materials. 3D memory device 100 can include peripheral device 162 on substrate 102. Peripheral device 162 can be formed "on" substrate 102, where the entirety or part of peripheral device 162 is formed in substrate 102 (e.g., below the top surface of substrate 102) and/or directly on substrate 102. Peripheral device 162 can include transistors 104 formed on substrate 102. Isolation regions (e.g., shallow trench isolations (STIs)) and doped regions (e.g., source regions and drain regions of transistors 104) can be formed in substrate 102 as well. In some aspects, peripheral device 162 can be formed on substrate 102 using complementary metal-oxide-semiconductor (CMOS) technology.

3D memory device 100 can include interconnect layer 106 above transistors 104 to transfer electrical signals to and from transistors 104. Interconnect layer 106 can include a plurality of interconnects (also referred to herein as "contacts"), including interconnect lines 108 and vertical interconnect access (via) contacts 110. As used herein, the term "interconnects" can broadly include any suitable types of interconnects, such as front-end-of-line (FEOL) interconnects, middle-end-of-line (MEOL) interconnects, and/or BEOL interconnects.

Interconnect layer 106 can further include one or more interlayer dielectric (ILD) layers (also known as "intermetal dielectric (IMD) layers") in which interconnect lines 108 and via contacts 110 can form. That is, interconnect layer 106 can include interconnect lines 108 and via contacts 110 in multiple ILD layers. Interconnect lines 108 and via contacts 110 in interconnect layer 106 can include conductive materials including, but not limited to, tungsten (W), cobalt (Co), copper (Cu), aluminum (Al), silicides, or any combination thereof. The ILD layers in interconnect layer 106 can include dielectric materials including, but not limited to, silicon oxide, silicon nitride, silicon oxynitride, low dielectric constant (low-k) dielectrics, or any combination thereof.

In some aspects, interconnect layer 106 can further include bonding contacts 112 at the top surface of interconnect layer 106. Bonding contacts 112 can include conductive materials including, but not limited to, W, Co, Cu, Al, silicides, or any combination thereof. The remaining areas at the top surface of interconnect layer 106 can be formed with dielectric materials including, but not limited to, silicon oxide, silicon nitride, silicon oxynitride, low-k dielectrics, or any combination thereof. Conductive materials (e.g., of bonding contacts 112) and dielectric materials at the top surface of interconnect layer 106 can be used for hybrid bonding as described below in detail.

3D memory device 100 can include memory array 160 above peripheral device 162. It is noted that X, Y, and Z axes are shown in FIG. 1 to further illustrate the spatial relationship of the components in 3D memory device 100. Substrate 102 includes two lateral surfaces (e.g., a top surface and a bottom surface) extending laterally in the X- and Y-directions (i.e., the lateral or width directions). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the Z-direction (i.e., the vertical or thickness direction) when the substrate is positioned in the lowest plane of the semiconductor device in the Z-direction. The same notion for describing spatial relationship is applied throughout the present disclosure.

In some aspects, 3D memory device 100 is a NAND flash memory device in which memory cells are provided in the form of an array of NAND memory strings 114 each extending vertically above peripheral device 162 (e.g., transistors 104) and substrate 102. Memory array 160 can include NAND memory strings 114 that extend vertically through a plurality of alternating conductive/dielectric layer pairs, each including conductor layer 116 and dielectric layer 118. The stacked conductor/dielectric layer pairs are also referred to herein as memory stack 120. Conductor layers 116 and dielectric layers 118 in memory stack 120 alternate in the vertical direction. In other words, except at the top or bottom of memory stack 120, each conductor layer 116 can be adjoined by two dielectric layers 118 on both sides, and each dielectric layer 118 can be adjoined by two conductor layers 116 on both sides. Conductor layers 116 can each have the same thickness or different thicknesses. Similarly, dielectric layers 118 can each have the same thickness or different thicknesses. Conductor layers 116 can include conductive materials including, but not limited to, W, Co, Cu, Al, doped silicon, silicides, or any combination thereof. Dielectric layers 118 can include dielectric materials including, but not limited to, silicon oxide, silicon nitride, silicon oxynitride, or any combination thereof.

Memory stack 120 can include an inner region (also known as a "core array region") and an outer region (also known as a "staircase region"). In some aspects, the inner region is the center region of memory stack 120 where NAND memory strings 114 are formed, and the outer region is the remaining region of memory stack 120 surrounding the inner region (including the sides and edges). As shown in FIG. 1, at least on one lateral side, the outer region of memory stack 120 can include staircase structure 122. The edges of the conductor/dielectric layer pairs in staircase structure 122 of memory stack 120 along the vertical direction away from substrate 102 (the positive Z-direction) are staggered laterally toward NAND memory strings 114. In other words, the edges of memory stack 120 in staircase structure 122 can be tilted toward the inner region as moving away from substrate 102 (from bottom to top). The slope of staircase structure 122 can face away from substrate 102. In some aspects, the length of each conductor/dielectric layer pair of memory stack 120 increases from the top to the bottom.

In some aspects, each two adjacent conductor/dielectric layer pairs in staircase structure 122 are offset by a nominally same distance in the vertical direction (Z-direction) and a nominally same distance in the lateral direction (X-direction). Each offset thus can form a "landing area" for word line fan-out in the vertical direction. Some conductor layers 116 in the conductor/dielectric layer pairs can function as word lines of 3D memory device 100 and extend laterally into staircase structure 122 for interconnection. As shown in FIG. 1, the offset of the edges of each adjacent conductor/dielectric layer pairs in staircase structure 122 is nominally the same, according to some aspects.

As shown in FIG. 1, each NAND memory string 114 can extend vertically through the inner region of memory stack 120 and include semiconductor channel 124 and a dielectric layer (also known as a "memory film"). In some aspects, semiconductor channel 124 includes silicon, such as amorphous silicon, polysilicon, or single crystalline silicon. In some aspects, the memory film is a composite layer including tunneling layer 126, storage layer 128 (also known as a "charge trap/storage layer"), and a blocking layer. Each NAND memory string 114 can have a cylindrical shape (e.g., a pillar shape). Semiconductor channel 124, tunneling layer 126, storage layer 128, and a blocking layer are arranged radially from the center toward the outer surface of the pillar in this order, according to some aspects. Tunneling layer 126 can include silicon oxide, silicon oxynitride, or any combination thereof. Storage layer 128 can include silicon nitride, silicon oxynitride, silicon, or any combination thereof. The blocking layer can include silicon oxide, silicon oxynitride, high dielectric constant (high-k) dielectrics, or any combination thereof.

In some aspects, NAND memory strings 114 further include a plurality of control gates (each being part of a word line). Each conductor layer 116 in memory stack 120 can act as a control gate for each memory cell of NAND memory string 114. Each NAND memory string 114 can include a source select gate at its upper end and a drain select gate at its lower end. As used herein, the "upper end" of a component (e.g., NAND memory string 114) is the end farther away from substrate 102 in the Z-direction, and the "lower end" of the component (e.g., NAND memory string 114) is the end closer to substrate 102 in the Z-direction. For each NAND memory string 114, the drain select gate can be disposed below the source select gate in 3D memory device 100.

In some aspects, 3D memory device 100 further includes semiconductor layer 130 disposed above and in contact with NAND memory strings 114, for example, on the upper end of each NAND memory string 114. Memory stack 120 can be disposed below semiconductor layer 130. Semiconductor layer 130 can be a thinned substrate on which memory stack 120 is formed. In some aspects, semiconductor layer 130 includes semiconductor plugs 132 electrically separated by isolation regions (e.g., STIs). In some aspects, each semiconductor plug 132 is disposed at the upper end of corresponding NAND memory string 114 and functions as the source of corresponding NAND memory string 114 and thus, can be considered as part of corresponding NAND memory string 114. Semiconductor plug 132 can include single crystalline silicon. Semiconductor plug 132 can be undoped, partially doped (in the thickness direction and/or the width direction), or fully doped by p-type or n-type dopants. In some aspects, semiconductor plug 132 can include SiGe, GaAs, Ge, or any other suitable materials.

In some aspects, 3D memory device 100 can further include gate line slit (GLS) 134 that extends vertically in the Z-direction through memory stack 120. GLS 134 can extend along the X-direction which is parallel to staircase structure 122 extending along the X-direction. FIG. 1 shows a cross-sectional view of GLS 134 along the YZ-plane and a separate (orthogonal) cross-sectional view of staircase structure 122 along the XZ-plane. GLS 134 can be used to form the conductor/dielectric layer pairs in memory stack 120 by a gate replacement process. In some aspects, GLS 134 is first filled with dielectric materials, for example, silicon oxide, silicon nitride, or any combination thereof, for separating NAND memory strings 114 into different regions (e.g., memory fingers and/or memory blocks). Then, GLS 134 can be filled with conductive and/or semiconductor materials, for example, W, Co, polysilicon, or any combination thereof, for electrically controlling an array common source (ACS), according to some aspects.

In some aspects, 3D memory device 100 can include local interconnects that are formed in one or more ILD layers and in contact with components in memory stack 120, such as the word lines (e.g., conductor layers 116) and NAND memory strings 114. The interconnects are referred to herein as "local interconnects" as they are in contact with the components in memory stack 120 directly for fan-out. The local interconnects can include word line contacts 136, bit line contacts 138, and source line contacts 140. Each local interconnect can include an opening (e.g., a via hole or a trench) filled with conductive materials including, but not limited to, W, Co, Cu, Al, silicides, or any combination thereof.

Word line contacts 136 can extend vertically through one or more ILD layers. Each word line contact 136 can have its lower end in contact with corresponding conductor layer 116 (e.g., at the landing area) in staircase structure 122 of memory stack 120 to individually address a corresponding word line of 3D memory device 100. In some aspects, each word line contact 136 is disposed above corresponding conductor layer 116. Each bit line contact 138 can be disposed below memory stack 120 and have its upper end in contact with the lower end (e.g., the drain end) of corresponding NAND memory string 114 to individually address corresponding NAND memory string 114. Multiple bit line contacts 138 are disposed below and in contact with multiple NAND memory strings 114, respectively, according to some aspects. As shown in FIG. 1, word line contacts 136 and bit line contacts 138 fan-out the corresponding memory stack components toward opposite vertical directions (the positive and negative Z-directions). Source line contacts 140 can extend vertically through one or more ILD layers. Each source line contact 140 can have its lower end in contact with corresponding semiconductor plug 132 (e.g., the source) of NAND memory string 114. In some aspects, each source line contact 140 is disposed above corresponding NAND memory string 114.

Similar to peripheral device 162, memory array 160 of 3D memory device 100 can also include interconnect layers for transferring electrical signals to and from NAND memory strings 114. As shown in FIG. 1, 3D memory device 100 can include array interconnect layer 142 below NAND memory strings 114. Array interconnect layer 142 can include a plurality of interconnects, including array interconnect lines 144 and array via contacts 146 in one or more ILD layers. In some aspects, array interconnect layer 142 includes array bonding contacts 148 at its bottom surface. Array interconnect lines 144, array via contacts 146, and array bonding contacts 148 can include conductive materials including, but not limited to, W, Co, Cu, Al, silicides, or any combination thereof. The remaining areas at the bottom surface of array interconnect layer 142 can be formed with dielectric materials including, but not limited to, silicon oxide, silicon nitride, silicon oxynitride, low-k dielectrics, or any combination thereof. Conductive materials (of array bonding contacts 148) and dielectric materials at the bottom surface of array interconnect layer 142 can be used for hybrid bonding as described below in detail.

As shown in FIG. 1, BEOL interconnect layer 150 can be disposed above NAND memory strings 114 and semiconductor layer 130 and can include interconnects, such as BEOL interconnect lines 152 and BEOL via contacts 154 in one or more ILD layers. BEOL interconnect layer 150 can further include BEOL contact pads 156 and a redistribution layer at the top surface of 3D memory device 100 for wire bonding and/or bonding with an interposer. BEOL interconnect layer 150 and array interconnect layer 142 can be formed at opposite sides of NAND memory strings 114. In some aspects, BEOL interconnect lines 152, BEOL via contacts 154, and BEOL contact pads 156 in BEOL interconnect layer 150 can transfer electrical signals between 3D memory device 100 and external circuits. BEOL interconnect layer 150 can be electrically connected to memory stack 120 by the local interconnects. As shown in FIG. 1, each word line contact 136 can have its upper end in contact with BEOL interconnect layer 150. Similarly, each source line contact 140 can have its upper end in contact with BEOL interconnect layer 150. The arrangement and configuration of staircase structure 122 and semiconductor layer 130 allow direct fan-out of the word lines (e.g., conductor layers 116) and the sources of NAND memory strings 114 through the local interconnects (e.g., word line contacts 136 and source line contacts 140) and BEOL interconnect layer 150 without detouring through array interconnect layer 142.

In some aspects, 3D memory device 100 further includes one or more through array contacts (TACs) that extend vertically through memory stack 120. Each TAC can extend through the entirety of memory stack 120, (e.g., all the conductor/dielectric layer pairs therein) and have its upper end in contact with BEOL interconnect layer 150 and its lower end in contact with array interconnect layer 142. TACs can thus make electrical connections between interconnect layer 106 and BEOL interconnect layer 150 and carry electrical signals from peripheral device 162 to BEOL interconnect layer 150 of 3D memory device 100.

Bonding interface 158 can be formed between interconnect layer 106 and array interconnect layer 142. Bonding contacts 112 can be bonded with array bonding contacts 148 at bonding interface 158. As shown in FIG. 1, peripheral device 162 (e.g., transistors 104) can be disposed below memory array 160 (e.g., NAND memory strings 114) in 3D memory device 100 after bonding. In 3D memory device 100, bonding interface 158 is disposed between memory array 160 (e.g., NAND memory strings 114) and peripheral device 162 (e.g., transistors 104), according to some aspects. Interconnect layer 106 can be between bonding interface 158 and peripheral device 162 (e.g., transistors 104), and array interconnect layer 142 can be between bonding interface 158 and memory array 160 (e.g., NAND memory strings 114).

In some aspects, a first semiconductor structure (e.g., memory array 160), including NAND memory strings 114, semiconductor layer 130 (e.g., a thinned substrate), array interconnect layer 142, BEOL interconnect layer 150, and word line contacts 136, can be bonded to a second semiconductor structure (e.g., peripheral device 162), including substrate 102, transistors 104, and interconnect layer 106, in a face-to-face manner at bonding interface 158. Array interconnect layer 142 can contact interconnect layer 106 at bonding interface 158. Peripheral device 162 and memory array 160 can be bonded using hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. The metal-metal bonding can be formed between array bonding contacts 148 and bonding contacts 112, and the dielectric-dielectric bonding can be formed between the dielectric materials at the remaining areas at bonding interface 158.

Exemplary Dual Gate Surrounding Gate Transistor (SGT) Device

Figure 2:
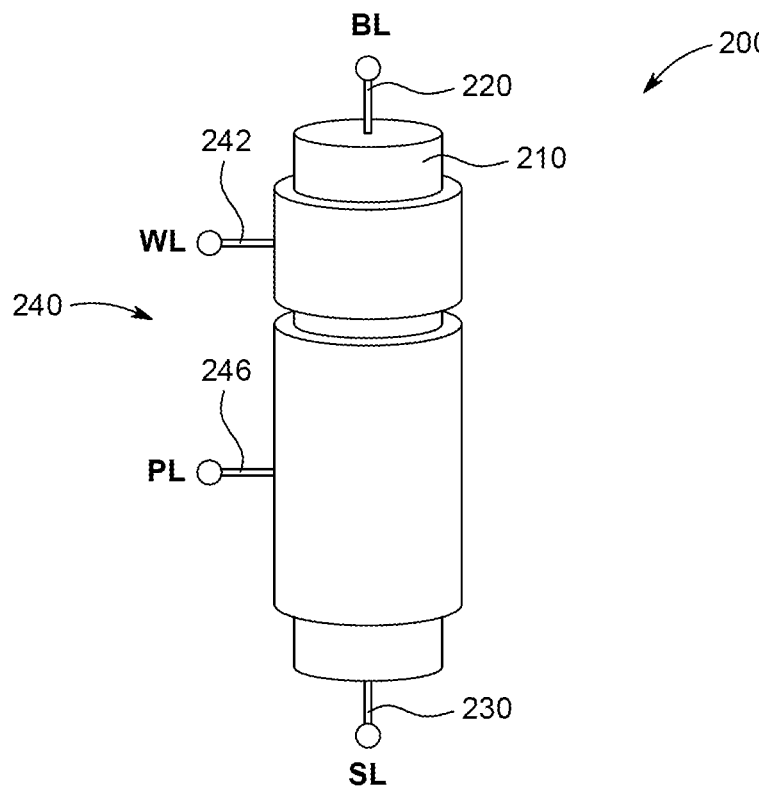
FIG. 2 is a schematic perspective illustration of a dual gate SGT device, according to an exemplary aspect.

FIG. 2 is a schematic perspective illustration of dual gate SGT device 200, according to an exemplary aspect. Dual gate SGT device 200 can be configured to provide two gates (e.g., word line 242 and plate line 246) surrounding a channel region (e.g., pillar 210) on all sides. Dual gate SGT device 200 can be further configured to operate as a volatile capacitor-free 3D memory device. Although dual gate SGT device 200 is shown in FIG. 2 as a stand-alone apparatus and/or system, the aspects of this disclosure can be used with other apparatuses, systems, and/or methods, such as, but not limited to, 3D memory device 100, DFM device 300, monocrystalline DFM device 300', monocrystalline DFM device 300", DFM array 400, DFM array 400', manufacturing method 500, manufacturing method 500', flow diagram 800, and/or flow diagram 900.

As shown in FIG. 2, dual gate SGT device 200 can include pillar 210, bit line (BL) 220, source line (SL) 230, and SGT cell 240. Pillar 210 can be configured to store charge (e.g., holes). BL 220 can be configured to address pillar 210 in dual gate SGT device 200 and act as a drain connection to pillar 210. SL 230 can be configured to address pillar 210 in dual gate SGT device 200 and act as a source connection to pillar 210. SGT cell 240 can be configured to address pillar 210 in dual gate SGT device 200 and act as a gate connection to pillar 210. In some aspects, different voltage combinations applied to BL 220, SL 230, and SGT cell 240 can define read, program (write), and erase operations in dual gate SGT device 200.

SGT cell 240 can include word line (WL) 242 and plate line (PL) 246. WL 242 can be configured to address pillar 210 in dual gate SGT device 200 and act as a first gate connection to pillar 210. In some aspects, WL 242 can act as a top select gate connection. In some aspects, WL 242 can provide a voltage to read, program, or erase charge on pillar 210. PL 246 can be configured to address pillar 210 in dual gate SGT device 200 and act as a second gate connection of pillar 210. In some aspects, PL 246 can act as a traditional current-valve gate (e.g., similar to a metal-oxide-semiconductor field-effect transistor (MOSFET) gate) for pillar 210 and cover a majority of a length of pillar 210. In some aspects, PL 246 can provide a voltage to read, program, or erase charge on pillar 210. In some aspects, dual gate SGT device 200 can form part of DFM device 300 shown in FIG. 3.

Exemplary Dynamic Flash Memory (DFM) Device

Figure 3:
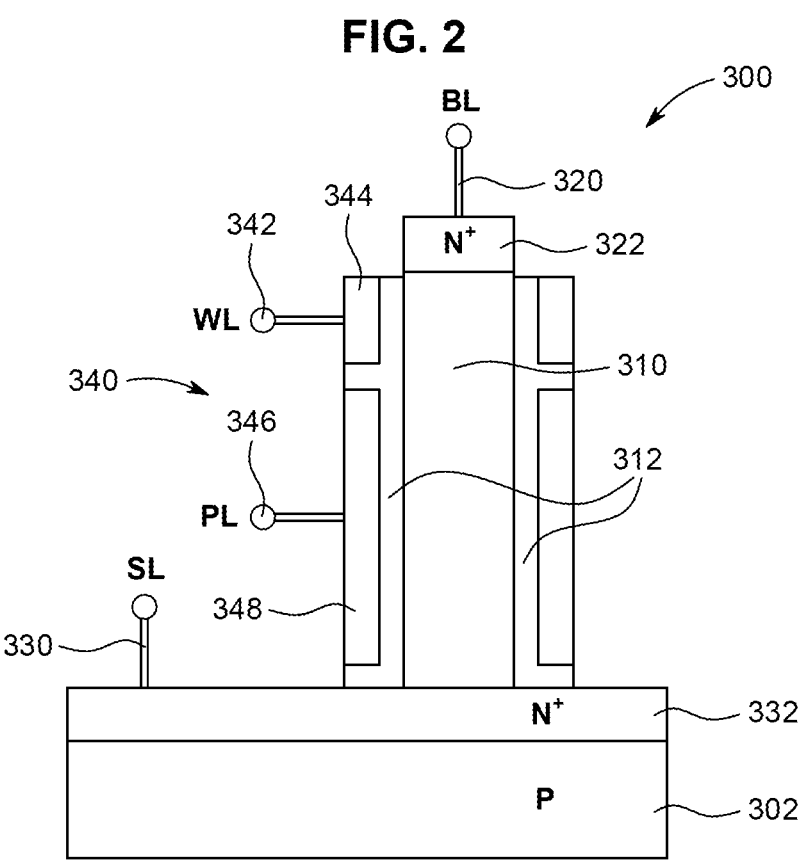
FIG. 3 is a schematic cross-sectional illustration of a DFM device, according to an exemplary aspect.
Figure 4:
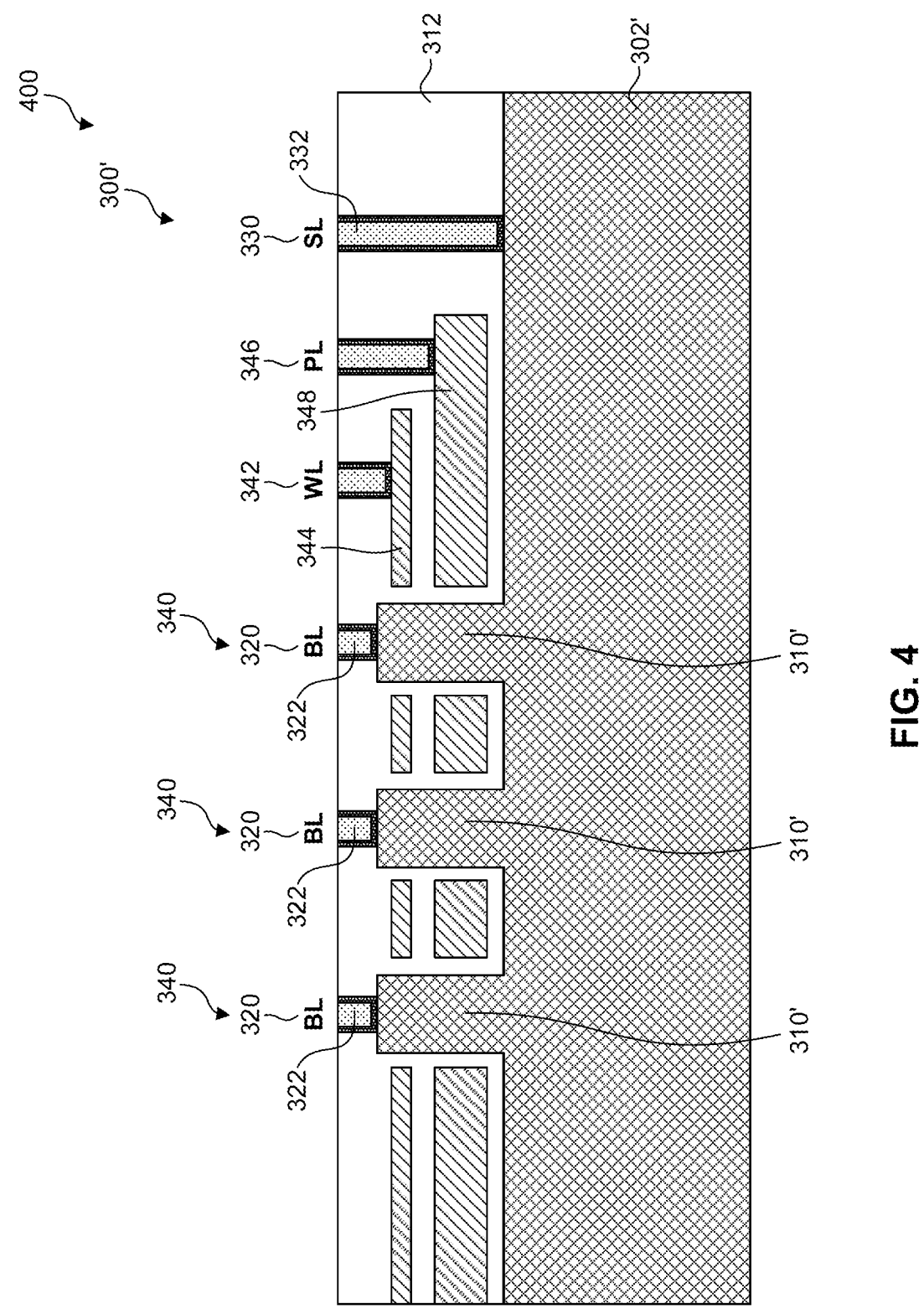
FIG. 4 is a schematic cross-sectional illustration of a monocrystalline DFM device in a DFM array, according to an exemplary aspect.

FIG. 3 illustrates DFM device 300, according to exemplary aspects. FIG. 3 is a schematic cross-sectional illustration of DFM device 300, according to an exemplary aspect. DFM device 300 can be configured to include dual gate SGT device 200 in a vertical arrangement on substrate 302 and operate as a volatile capacitor-free 3D memory device. DFM device 300 can be further configured to provide faster operation speeds and higher density than DRAM or other types of volatile memory. DFM device 300 can be further configured to provide block refresh and block erase operations similar to flash memory functionality. Although DFM device 300 is shown in FIGS. 3 and 4 as a stand-alone apparatus and/or system, the aspects of this disclosure can be used with other apparatuses, systems, and/or methods, such as, but not limited to, 3D memory device 100, dual gate SGT device 200, monocrystalline DFM device 300', monocrystalline DFM device 300", DFM array 400, DFM array 400', manufacturing method 500, manufacturing method 500', flow diagram 800, and/or flow diagram 900.

As shown in FIG. 3, DFM device 300 can include substrate 302, pillar 310, dielectric 312, bit line (BL) 320, BL contact 322, source line (SL) 330, SL contact 332, and DFM cell 340. Substrate 302 can be configured to support pillar 310, dielectric 312, BL contact 322, SL contact 332, and DFM cell 340. Substrate 302 can be coupled to SL contact 332. In some aspects, substrate 302 can be a p-type semiconductor (e.g., p), for example, doped silicon. Pillar 310 can be configured to store charge (e.g., holes). Pillar 310 can be between BL contact 322 and SL contact 332. Dielectric 312 can surround pillar 310 and be configured to provide electrical insulation between pillar 310 and DFM cell 340 (e.g., word line contact 344 and plate line contact 346). In some aspects, dielectric 312 can be a high-k dielectric configured to increase a gate capacitance and decrease a leakage current in pillar 310.

BL 320 can be configured to address pillar 310 in DFM device 300 and be coupled to BL contact 322. BL contact 322 can be configured to act as a drain connection to pillar 310. In some aspects, BL contact 322 can be n-type (e.g., n+) and pillar 310 can be p-type (e.g., p). SL 330 can be configured to address pillar 310 in DFM device 300 and be coupled to SL contact 332. SL contact 332 can be configured to act as a source connection to pillar 310. In some aspects, SL contact 332 can be n-type (e.g., n+) and pillar 310 can be p-type (e.g., p). DFM cell 340 can be configured to address pillar 310 in DFM device 300 and act as a gate connection to pillar 310. In some aspects, different voltage combinations applied to BL 320, SL 330, and DFM cell 340 can define read, program (write), and erase operations in DFM device 300.

DFM cell 340 can include word line (WL) 342, WL contact 344, plate line (PL) 346, and PL contact 348. WL 342 can be configured to address pillar 310 in DFM device 300 and be coupled to WL contact 344. WL contact 344 can be configured to act as a first gate connection to pillar 310. WL contact 344 can surround dielectric 312 which surrounds pillar 310 thereby forming a first concentric transistor. In some aspects, WL contact 344 can include a conductive material (e.g., metal, polysilicon, tungsten, etc.). In some aspects, WL 342 can act as a top select gate connection. In some aspects, WL 342 can provide voltage to WL contact 344, thereby inducing an electric field within pillar 310, to read, program, or erase charge on pillar 310.

PL 346 can be configured to address pillar 310 in DFM device 300 and be coupled to PL contact 348. PL contact 348 can be configured to act as a second gate connection to pillar 310. PL contact 348 can surround dielectric 312 which surrounds pillar 310 thereby forming a second concentric transistor. In some aspects, PL contact 348 can include a conductive material (e.g., metal, polysilicon, tungsten, etc.). In some aspects, PL 346 can act as a traditional current-valve gate (e.g., similar to a MOSFET gate) for pillar 310 and cover a majority of a length of pillar 310. In some aspects, PL 346 can provide voltage to PL contact 348, thereby inducing an electric field within pillar 310, to read, program, or erase charge on pillar 310.

Exemplary Monocrystalline DFM Devices

As discussed above, DRAM is a volatile memory that uses charge stored on a capacitor to represent information. DRAM stores each bit in a memory cell that includes a transistor and a capacitor (e.g., 1T1C). Charge levels greater than a certain threshold can represent a first logic level (e.g., 1 state) and charge levels less than another threshold amount can represent a second logic level (e.g., 0 state). Leakage currents and various parasitic effects limit the length of time a capacitor can hold charge. Each time data is read, it must be rewritten to ensure retention and regular data refresh cycles must be performed. DRAM retention times can be as low as 32 ms during high temperature operations (e.g., greater than 85° C.) and can require refresh rates of about 31 Hz.

Flash is a non-volatile memory that uses charge stored on a floating gate to represent information. Flash stores each bit in a memory cell that includes a transistor with a floating gate. The amount of charge on the floating gate will determine whether the transistor will conduct when a fixed set of read bias conditions are applied. Flash can retain charge for a long period of time since the floating gate is completely surrounded by insulators. Further, the act of reading the data can be performed non-destructively without loss of the information. In addition, flash can quickly erase entire blocks or pages of data simultaneously (e.g., NAND flash).

Current 1T1C DRAM is approaching a process limit. The manufacturing of 1T1C DRAM devices with small-node capacitors to retain charge is becoming more difficult due to increased current leakage, increased power consumption, degraded operating voltage margins, and decreased retention times. Further, current single transistor (1T) capacitor-free DRAM (e.g., ZRAM, TTRAM, ARAM, etc.) devices need further improvement and optimization for manufacturable integration and operation solutions. Current 1T DRAM devices have serious problems due to junction leakage and large capacitive coupling between word lines and the transistor floating body. In addition, current 1T DRAM devices have extremely narrow operational voltage margins between first and second logic levels (e.g., 1 state and 0 state).

Aspects of monocrystalline DFM apparatuses, systems, and methods as discussed below can provide a capacitor-free monocrystalline dynamic random-access memory device to decrease defects, increase manufacturing efficiency, decrease leakage current, decrease junction current, decrease power consumption, increase charge retention times, and/or decrease refresh rates.

FIG. 4 illustrates monocrystalline DFM device 300', according to exemplary aspects. FIG. 4 is a schematic cross-sectional illustration of monocrystalline DFM device 300' in DFM array 400, according to an exemplary aspect. Monocrystalline DFM device 300' can be configured to operate as a volatile capacitor-free monocrystalline dynamic random-access 3D memory device. Monocrystalline DFM device 300' can be further configured to decrease defects (e.g., lattice defects, vacancy defects, dislocation defects, pipeline defects, stress defects, strain defects, etc.). Monocrystalline DFM device 300' can be further configured to increase manufacturing efficiency. Monocrystalline DFM device 300' can be further configured to decrease leakage current, decrease junction current, and decrease power consumption. Monocrystalline DFM device 300' can be further configured to increase charge retention times (e.g., greater than 100 ms at 85° C. operating temperature) and decrease refresh rates (e.g., less than 10 Hz).

Monocrystalline DFM device 300' can be further configured to provide faster operation speeds and higher density than DRAM or other types of volatile memory. Monocrystalline DFM device 300' can be further configured to provide block refresh and block erase operations similar to flash memory functionality. Although monocrystalline DFM device 300' is shown in FIG. 4 as a stand-alone apparatus and/or system, the aspects of this disclosure can be used with other apparatuses, systems, and/or methods, such as, but not limited to, 3D memory device 100, dual gate SGT device 200, DFM device 300, monocrystalline DFM device 300", DFM array 400, DFM array 400', manufacturing method 500, manufacturing method 500', flow diagram 800, and/or flow diagram 900.

The aspects of DFM device 300 shown in FIG. 3, for example, and the aspects of monocrystalline DFM device 300' shown in FIG. 4 may be similar. Similar reference numbers are used to indicate features of the aspects of DFM device 300 shown in FIG. 3 and the similar features of the aspects of monocrystalline DFM device 300' shown in FIG. 4. Monocrystalline DFM device 300' includes monocrystalline pillar 310' and monocrystalline substrate 302' rather than pillar 310 and substrate 302 of DFM device 300 shown in FIG. 3.

As shown in FIG. 4, monocrystalline DFM device 300' can include monocrystalline substrate 302', monocrystalline pillar 310', dielectric 312, bit line (BL) 320, BL contact 322, source line (SL) 330, SL contact 332, and DFM cell 340. In some aspects, monocrystalline DFM device 300' can be a vertical 3D memory device. In some aspects, monocrystalline DFM device 300' can be part of a memory array, for example, memory array 160 of 3D memory device 100 shown in FIG. 1 and/or DFM array 400 shown in FIG. 4. In some aspects, as shown in FIG. 4, DFM array 400 can include one or more monocrystalline DFM devices 300'.

Monocrystalline substrate 302' can be configured to support monocrystalline pillar 310', dielectric 312, BL contact 322, SL contact 332, and DFM cell 340. Monocrystalline substrate 302' can be coupled to SL contact 332. In some aspects, monocrystalline substrate 302' can be a p-type semiconductor (e.g., p), for example, doped silicon. In some aspects, monocrystalline substrate 302' can include any planar monocrystalline material, for example, Si, Ge, SiGe, GaAs, Group IV semiconductor, Group III-V semiconductor, Group II-VI semiconductor, graphene, sapphire, and/or any other single crystal material. In some aspects, as shown in FIG. 4, monocrystalline substrate 302' can support one or more DFM cells 340.

Monocrystalline pillar 310' can be configured to store electrical charge (e.g., holes). Monocrystalline pillar 310' can be further configured to decrease defects, for example, lattice defects, vacancy defects, dislocation defects, pipeline defects, stress defects, and/or strain defects due to the crystalline structure of monocrystalline pillar 310'. Monocrystalline pillar 310' can be between BL contact 322 and SL contact 332. In some aspects, monocrystalline pillar 310' can be formed from monocrystalline substrate 302'. In some aspects, monocrystalline pillar 310' can include a monocrystalline material, for example, Si, doped Si, Ge, SiGe, GaAs, Group IV semiconductor, Group III-V semiconductor, Group II-VI semiconductor, graphene, sapphire, and/or any other monocrystalline material.

In some aspects, the monocrystalline material can include Si, Ge, SiGe, GaAs, GaP, GaSb, InAs, InSb, CdS, CdSe, CdTe, ZnS, ZnSe, ZnTe, graphene, sapphire, Group IV semiconductor, Group III-V semiconductor, Group II-VI semiconductor, or any other single crystal material.

In some aspects, the monocrystalline material can be configured to decrease a defect concentration in monocrystalline pillar 310'. For example, the defect concentration can be no greater than about $1\times10^{11}$ cm$^{-2}$. In some aspects, the low defect concentration in monocrystalline pillar 310' decreases lattice defects, vacancy defects, dislocation defects, pipeline defects, stress defects, and/or strain defects.

In some aspects, the monocrystalline material can be configured to decrease a leakage current in monocrystalline pillar 310'. For example, the leakage current can be no greater than about 1 pA. In some aspects, the low leakage current in monocrystalline pillar 310' can decrease power consumption in monocrystalline DFM device 300'.

In some aspects, a retention time of storing the electrical charge (e.g., holes) in the monocrystalline pillar 310' is greater than about 100 ms. For example, the retention rate can be greater than about 100 ms for an operating temperature of at least 85° C. In some aspects, the long retention time in monocrystalline pillar 310' can decrease a refresh rate in monocrystalline DFM device 300', for example, to less than 10 Hz.

In some aspects, monocrystalline pillar 310' can be doped (e.g., p-type). In some aspects, monocrystalline pillar 310' can have a doping concentration of about $1\times10^{16}$ cm$^{-3}$ to about $5\times10^{18}$ cm$^{-3}$. For example, monocrystalline pillar 310' can have a doping concentration of about $1\times10^{18}$ cm$^{-3}$. In some aspects, monocrystalline pillar 310' can have a diameter of about 1 nm to about 100 nm. For example, monocrystalline pillar 310' can have a diameter of about 50 nm. In some aspects, monocrystalline pillar 310' can be monolithic. For example, as shown in FIG. 4, monocrystalline pillar 310' can be a single monolithic vertical pillar extending from monocrystalline substrate 302'. In some aspects, monocrystalline pillar 310' can be formed from the same material as monocrystalline substrate 302', for example, by anisotropic etching.

Dielectric 312 can be configured to provide electrical insulation between monocrystalline pillar 310' and DFM cell 340. Dielectric 312 can surround monocrystalline pillar 310'. In some aspects, dielectric 312 can include a dielectric material, for example, oxide, nitride, oxynitride, ceramic, glass, SOG, polymer, plastic, thermoplastic, resin, laminate, high-k dielectric, a combination thereof, and/or any other electrically insulating material. In some aspects, dielectric 312 can be silicon oxide. In some aspects, dielectric 312 can be a high-k dielectric configured to increase a gate capacitance and decrease a leakage current in monocrystalline pillar 310'. In some aspects, dielectric 312 can have a radial thickness of about 1 nm to about 30 nm. For example, dielectric 312 can have a radial thickness of about 3 nm. In some aspects, dielectric 312 can be monolithic. For example, as shown in FIG. 4, dielectric 312 can be a single monolithic vertical dielectric.

BL 320 can be configured to address monocrystalline pillar 310' in monocrystalline DFM device 300'. BL 320 can be further configured to flow electrical charge through DFM cell 340. BL 320 can be coupled to BL contact 322. BL contact 322 can be configured to act as a drain connection to monocrystalline pillar 310'. BL contact 322 can be coupled to DFM cell 340. In some aspects, BL contact 322 can be n-type (e.g., n+) and monocrystalline pillar 310' can be p-type (e.g., p). In some aspects, BL contact 322 can include a conductive material, for example, a metal, a doped semiconductor, polysilicon, tungsten, and/or any other suitable conductor.

SL 330 can be configured to address monocrystalline pillar 310' in monocrystalline DFM device 300'. SL 330 can be further configured to flow electrical charge through DFM cell 340. SL 330 can be coupled to SL contact 332. SL contact 332 can be configured to act as a source connection to monocrystalline pillar 310'. SL contact 332 can be coupled to DFM cell 340. In some aspects, SL contact 332 can be n-type (e.g., n+) and monocrystalline pillar 310' can be p-type (e.g., p). In some aspects, SL contact 332 can include a conductive material, for example, a metal, a doped semiconductor, polysilicon, tungsten, and/or any other suitable conductor. In some aspects, different voltage combinations applied to BL 320, SL 330, and DFM cell 340 can define read, program (write), and erase operations in monocrystalline DFM device 300'.

DFM cell 340 can be configured to read, program, and erase electrical charge on monocrystalline pillar 310'. DFM cell 340 can be coupled to BL contact 322 and SL contact 332. DFM cell 340 can include word line (WL) 342, WL contact 344, plate line (PL) 346, and PL contact 348. WL 342 can be configured to address monocrystalline pillar 310' in monocrystalline DFM device 300'. WL 342 can be further configured to address and non-destructively read electrical charge on monocrystalline pillar 310'. In some aspects, WL 342 can act as a top select gate connection. WL 342 can be coupled to WL contact 344. WL contact 344 can be configured to act as a first gate connection to monocrystalline pillar 310'. WL contact 344 can surround a first portion of dielectric 312 which surrounds a first portion of monocrystalline pillar 310' thereby forming a first concentric transistor in DFM cell 340. In some aspects, WL contact 344 can include a conductive material (e.g., metal, polysilicon, tungsten, etc.). In some aspects, WL 342 can provide voltage to WL contact 344, thereby inducing an electric field within monocrystalline pillar 310', to read, program, or erase charge on monocrystalline pillar 310'. In some aspects, as shown in FIG. 4, WL contact 344 can be between BL contact 322 and PL contact 348.

PL 346 can be configured to address monocrystalline pillar 310' in monocrystalline DFM device 300'. PL 346 can be further configured to program (e.g., write) monocrystalline pillar 310'. In some aspects, PL 346 can act as a traditional current-valve gate (e.g., similar to a MOSFET gate) for monocrystalline pillar 310' and cover a majority of a length of monocrystalline pillar 310'. PL 346 can be coupled to PL contact 348. PL contact 348 can be configured to act as a second gate connection to monocrystalline pillar 310'. PL contact 348 can surround a second portion of dielectric 312 which surrounds a second portion of monocrystalline pillar 310' thereby forming a second concentric transistor in DFM cell 340. In some aspects, PL contact 348 can include a conductive material (e.g., metal, polysilicon, tungsten, etc.). In some aspects, PL 346 can provide voltage to PL contact 348, thereby inducing an electric field within monocrystalline pillar 310', to read, program, or erase charge on monocrystalline pillar 310'. In some aspects, DFM cell 340 can form a DFM device, for example, monocrystalline DFM device 300' shown in FIG. 4.

In some aspects, in a first logic state (1 state), a majority of monocrystalline pillar 310' retains charge of at least $1 \times 10^{17}$ cm$^{-3}$ after 100 ms at an operating temperature of 85° C. For example, a portion of monocrystalline pillar 310' adjacent PL contact 348 retains charge of at least $1 \times 10^{17}$ cm$^{-3}$. In some aspects, in a second logic state (0 state), a majority of monocrystalline pillar 310' has charge no greater than $1 \times 10^{15}$ cm$^{-3}$ after 100 ms at an operating temperature of 85° C. For example, a portion of monocrystalline pillar 310' adjacent PL contact 348 has charge no greater than least $1 \times 10^{15}$ cm$^{-3}$.

Figure 6:
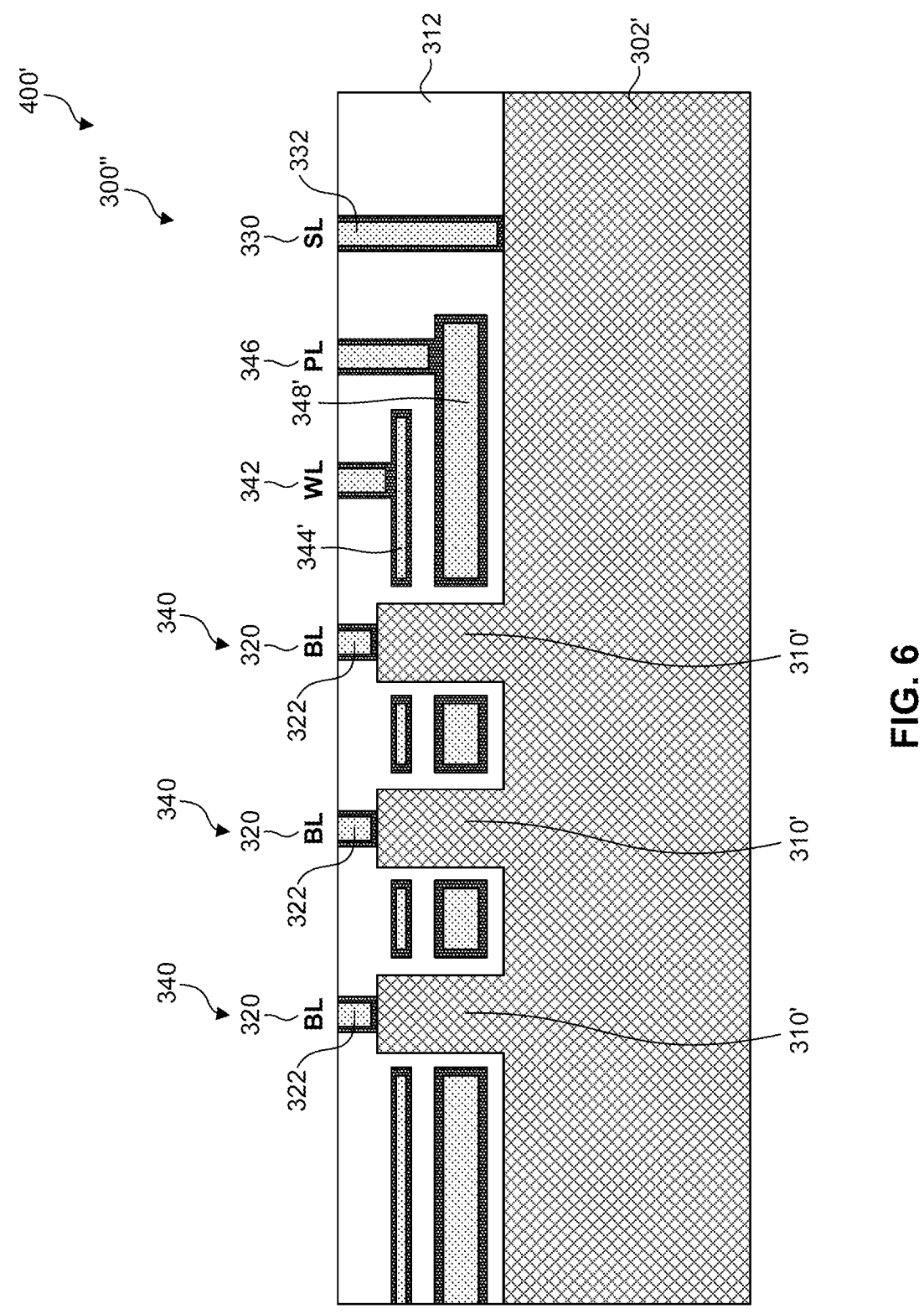
FIG. 6 is a schematic cross-sectional illustration of a monocrystalline DFM device in a DFM array, according to an exemplary aspect.

FIG. 6 illustrates monocrystalline DFM device 300", according to exemplary aspects. FIG. 6 is a schematic cross-sectional illustration of monocrystalline DFM device 300" in DFM array 400', according to an exemplary aspect. Although monocrystalline DFM device 300" is shown in FIG. 6 as a stand-alone apparatus and/or system, the aspects of this disclosure can be used with other apparatuses, systems, and/or methods, such as, but not limited to, 3D memory device 100, dual gate SGT device 200, DFM device 300, monocrystalline DFM device 300', DFM array 400, DFM array 400', manufacturing method 500, manufacturing method 500', flow diagram 800, and/or flow diagram 900.

The aspects of monocrystalline DFM device 300' shown in FIG. 4, for example, and the aspects of monocrystalline DFM device 300" shown in FIG. 6 may be similar. Similar reference numbers are used to indicate features of the aspects of monocrystalline DFM device 300' shown in FIG. 4 and the similar features of the aspects of monocrystalline DFM device 300" shown in FIG. 6. Monocrystalline DFM device 300" includes WL contact 344' and PL contact 348' rather than WL contact 344 and PL contact 348 of monocrystalline DFM device 300' shown in FIG. 4.

As shown in FIG. 6, monocrystalline DFM device 300" can include monocrystalline substrate 302', monocrystalline pillar 310', dielectric 312, bit line (BL) 320, BL contact 322, source line (SL) 330, SL contact 332, and DFM cell 340. DFM cell 340 can include word line (WL) 342, WL contact 344', plate line (PL) 346, and PL contact 348'. In some aspects, WL contact 344' and PL contact 348' can be formed from a conductive refill process, for example, manufacturing method 500' shown in FIGS. 7A through 7I. In some aspects, WL contact 344' and PL contact 348' can include a conductive material (e.g., metal, polysilicon, tungsten, etc.). In some aspects, monocrystalline DFM device 300" can be part of a memory array, for example, memory array 160 of 3D memory device 100 shown in FIG. 1 and/or DFM array 400' shown in FIG. 6. In some aspects, as shown in FIG. 6, DFM array 400' can include one or more monocrystalline DFM devices 300".

Exemplary Manufacturing Methods

FIGS. 5A through 5J illustrate manufacturing method 500 for forming monocrystalline DFM device 300' shown in FIG. 4, according to exemplary aspects. It is to be appreciated that not all steps in FIGS. 5A through 5J are needed to perform the disclosure provided herein. Further, some of the steps may be performed simultaneously, sequentially, and/or in a different order than shown in FIGS. 5A through 5J. Manufacturing method 500 shall be described with reference to FIGS. 5A through 5J. However, manufacturing method 500 is not limited to those example aspects. In some aspects, manufacturing method 500 can increase manufacturing efficiency and decrease manufacturing defects, for example, by using a channel first manufacturing scheme with monocrystalline pillar 310' formed directly from monocrystalline substrate 302' to fabricate monocrystalline DFM device 300' shown in FIG. 4.

In step 500A, as shown in the example of FIG. 5A, monocrystalline substrate 302' is presented.

In step 500B, as shown in the example of FIG. 5B, monocrystalline pillar 310' is formed from monocrystalline substrate 302'. In some aspects, monocrystalline pillar 310' is formed by forming first, second, third, and/or fourth channel trenches 510, 512, 514, 516 in monocrystalline substrate 302'. For example, first, second, third, and/or fourth channel trenches 510, 512, 514, 516 can be formed by etching, for example, anisotropic etching.

Figure 5C:
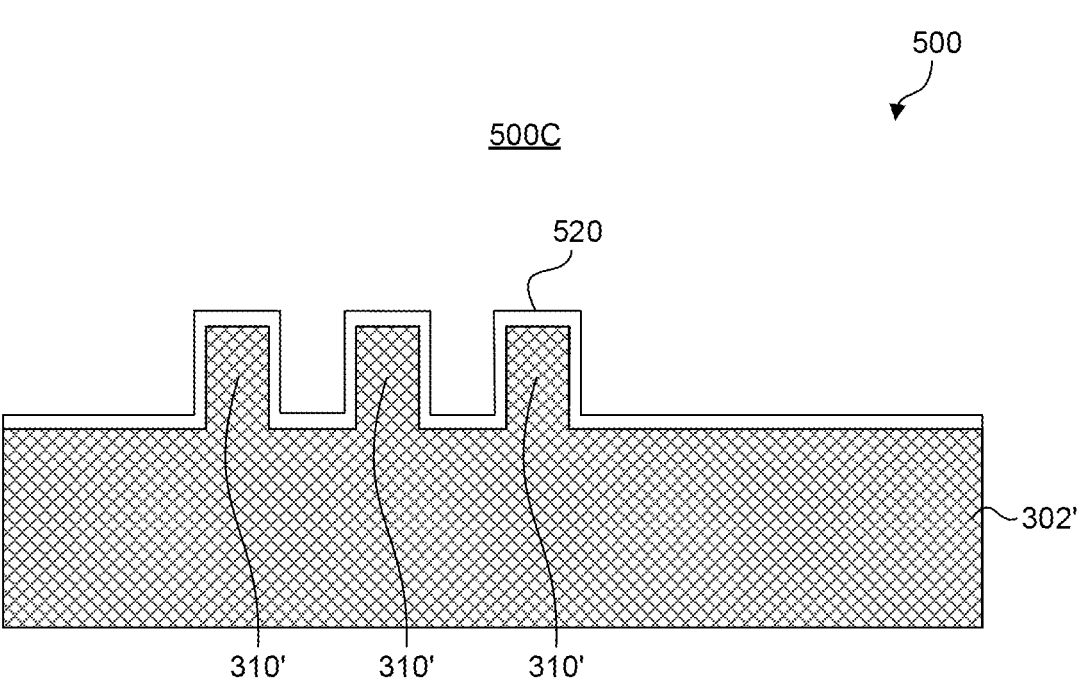

In step 500C, as shown in the example of FIG. 5C, dielectric layer 520 is formed (e.g., deposited) over monocrystalline substrate 302' and monocrystalline pillar 310', surrounding monocrystalline pillar 310'. In some aspects, dielectric layer 520 can be silicon oxide. In some aspects, dielectric layer 520 can include a high-k dielectric, an oxide, a nitride, or a combination thereof.

Figure 5D:
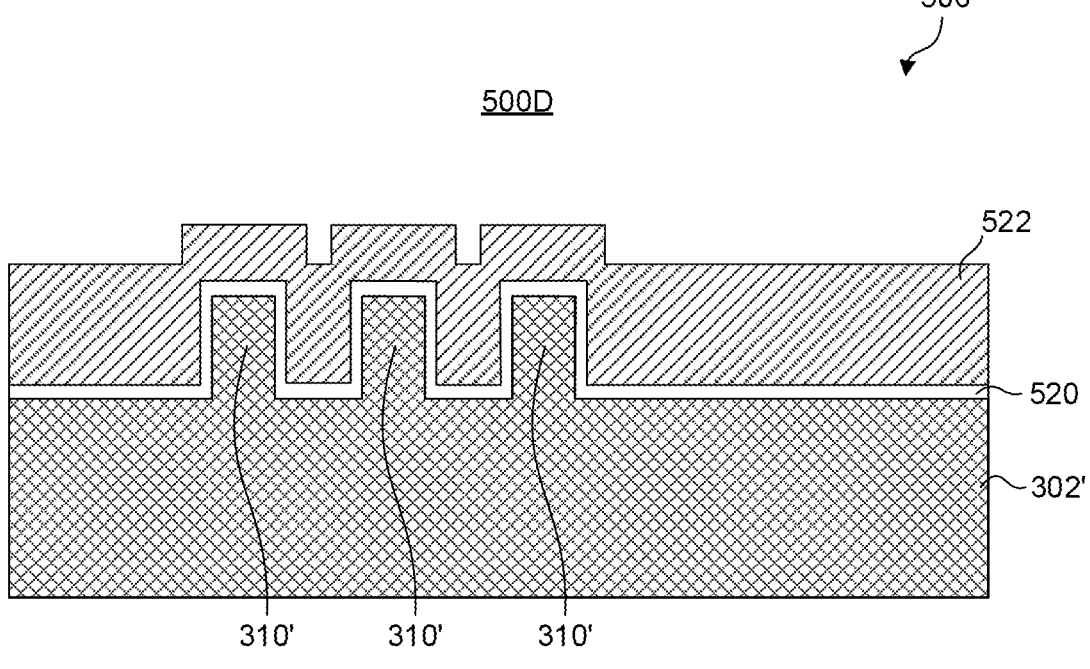

In step 500D, as shown in the example of FIG. 5D, conductive layer 522 is formed (e.g., deposited) over dielectric layer 520. In some aspects, conductive layer 522 can be polysilicon. In some aspects, conductive layer 522 can include polysilicon, tungsten, aluminum, a metal, or any other conductive material.

In step 500E, as shown in the example of FIG. 5E, monocrystalline pillar 310', dielectric layer 520, and conductive layer 522 are planarized to form planar surface 530. For example, as shown in FIG. 5E, an upper portion of monocrystalline pillar 310', dielectric layer 520, and conductive layer 522 are removed by planarization such that monocrystalline pillar 310' is exposed. In some aspects, planarizing can include chemical mechanical polishing (CMP).

In step 500F, as shown in the example of FIG. 5F, conductive layer 522 can be recessed relative to monocrystalline pillar 310' and dielectric layer 520. In some aspects, conductive layer 522 can be recessed by forming first, second, third, and/or fourth PL trenches 540, 542, 544, 546 in conductive layer 522. For example, first, second, third, and/or fourth PL trenches 540, 542, 544, 546 can be formed by selective anisotropic etching. In some aspects, conductive layer 522 can be configured to form a PL contact, for example, PL contact 348 shown in FIG. 4.

Figure 5G:
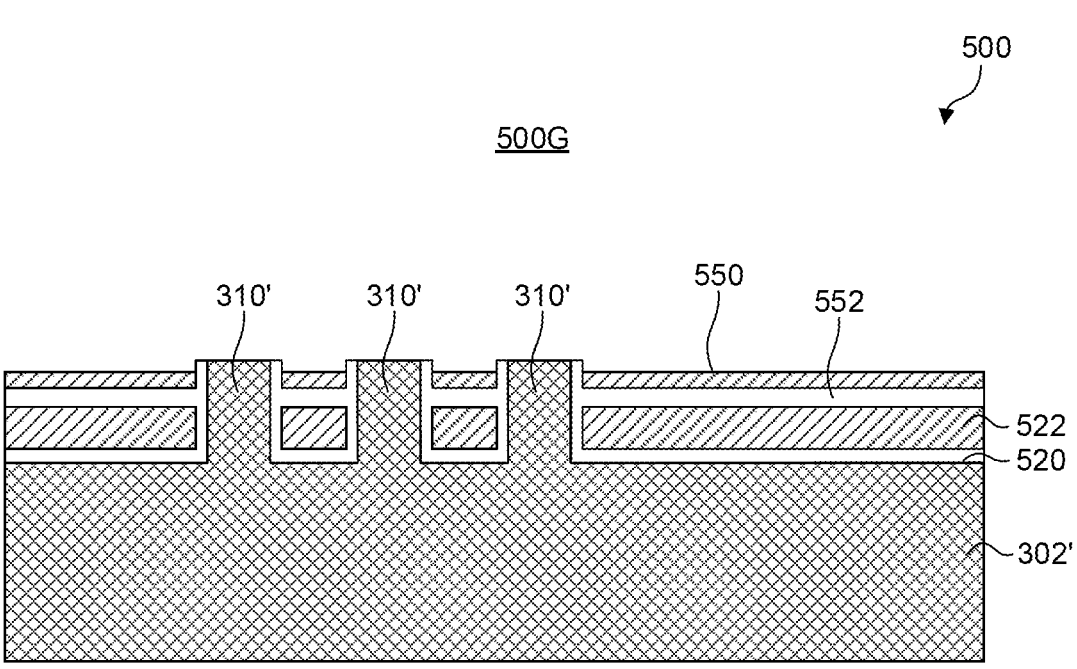

In step 500G, as shown in the example of FIG. 5G, second dielectric layer 552 is formed (e.g., deposited) atop conductive layer 522 and second conductive layer 550 is formed (e.g., deposited) atop second dielectric layer 552. In some aspects, second conductive layer 550 can be configured to form a WL contact, for example, WL contact 344 shown in FIG. 4. In some aspects, second conductive layer 550 can include polysilicon, tungsten, aluminum, a metal, or any other conductive material.

Figure 5H:
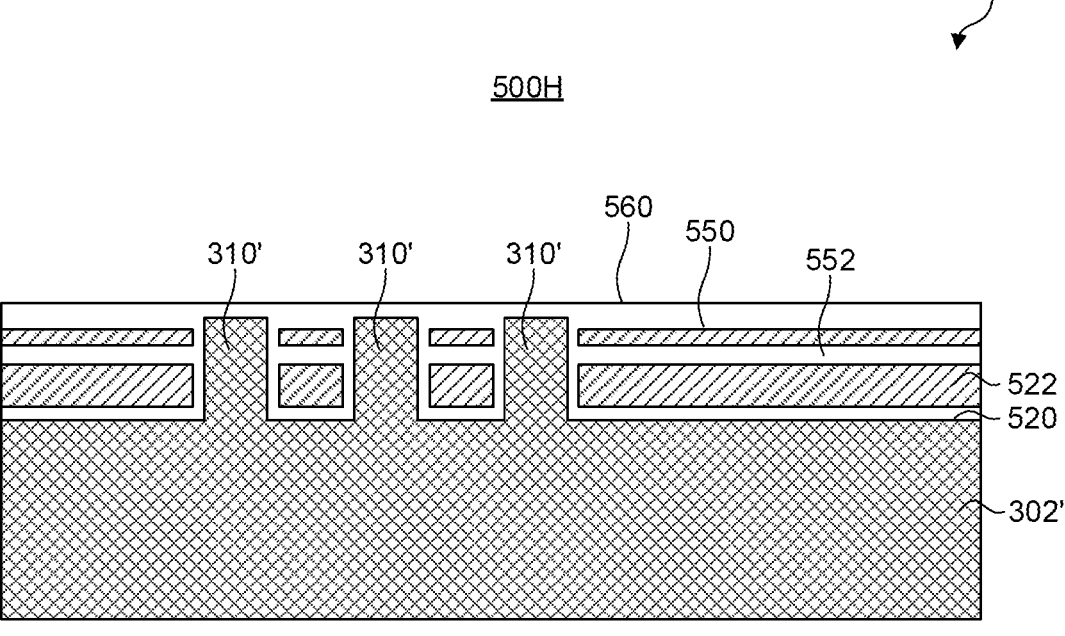

In step 500H, as shown in the example of FIG. 5H, third dielectric layer 560 is deposited atop second conductive layer 550. In some aspects, third dielectric layer 560 can be configured to form an insulating capping layer.

Figure 5I:
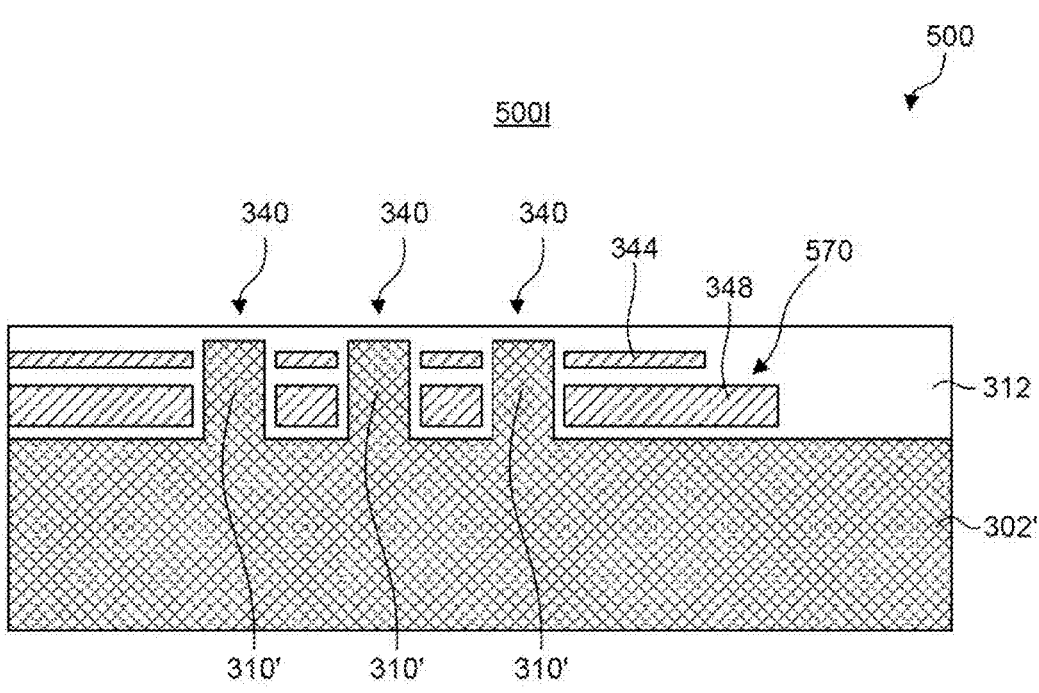

In step 500I, as shown in the example of FIGS. 4 and 5I, staircase structure 570 can be formed in dielectric 312. In some aspects, staircase structure 570 can be formed by etching portions of dielectric layer 520, conductive layer 522, second dielectric layer 552, second conductor layer 550, and/or third dielectric layer 560 and refilling and/or annealing to form dielectric 312. In some aspects, staircase structure 570 can form WL contact 344 and PL contact 348 of DFM cell 340 as shown in FIG. 4.

Figure 5J:
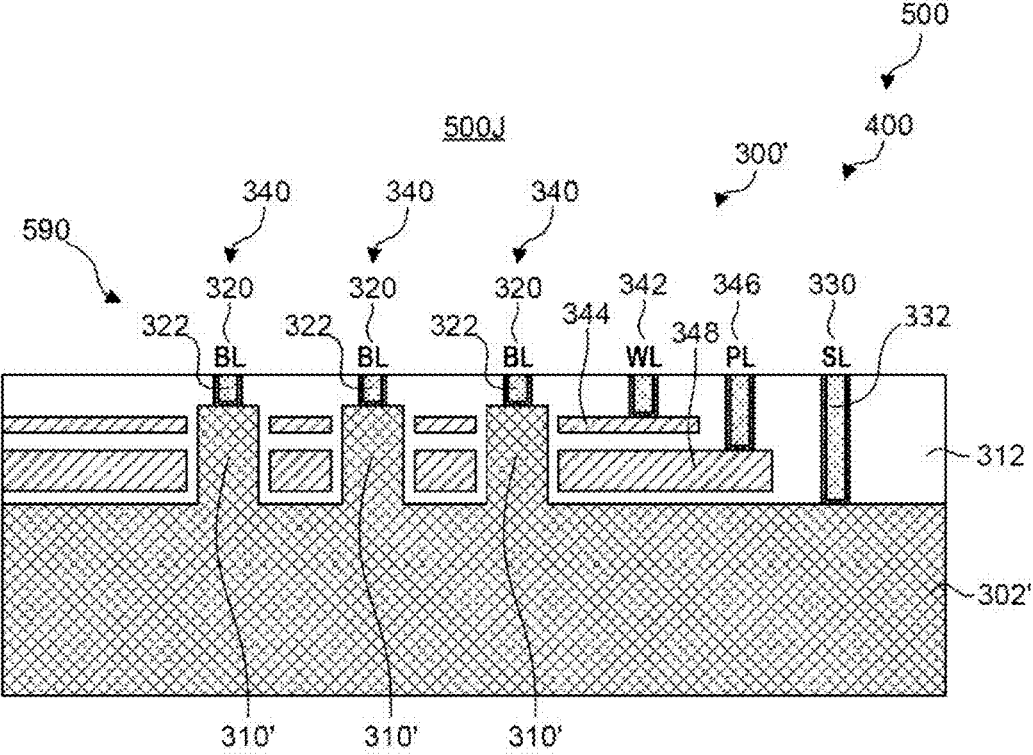

In step 500J, as shown in the example of FIGS. 4 and 5J, interconnects 590 are formed to monocrystalline pillar 310' (e.g., BL 320), WL contact 344 of DFM cell 340 (e.g., WL 342), PL contact 348 of DFM cell 340 (e.g., PL 346), and monocrystalline substrate 302' (e.g., SL 330), respectively, to form one or more monocrystalline DFM devices 300' shown in FIG. 4. In some aspects, manufacturing method 500 can include forming a DFM device, for example, monocrystalline DFM device 300' shown in FIG. 4. In some aspects, manufacturing method 500 can include forming a NAND DFM device.

FIGS. 7A through 7I illustrate manufacturing method 500' for forming monocrystalline DFM device 300" shown in FIG. 6, according to exemplary aspects. It is to be appreciated that not all steps in FIGS. 7A through 7I are needed to perform the disclosure provided herein. Further, some of the steps may be performed simultaneously, sequentially, and/or in a different order than shown in FIGS. 7A through 7I. Manufacturing method 500' shall be described with reference to FIGS. 5A, 5B, 5C, and 7A through 7I. However, manufacturing method 500' is not limited to those example aspects. In some aspects, manufacturing method 500' can increase manufacturing efficiency and decrease manufacturing defects, for example, by using a channel first manufacturing scheme with monocrystalline pillar 310' formed directly from monocrystalline substrate 302' to fabricate monocrystalline DFM device 300" shown in FIG. 6.

The aspects of manufacturing method 500 shown in FIGS. 5A through 5J, for example, and the aspects of manufacturing method 500' shown in FIGS. 7A through 7I may be similar. Similar reference numbers are used to indicate features of the aspects of manufacturing method

500 shown in FIGS. 5A through 5J and the similar features of the aspects of manufacturing method 500' shown in FIGS. 7A through 7I. Manufacturing method 500' includes steps 700A through 700I shown in FIGS. 7A through 7I, with first removable dielectric layer 521' and second removable dielectric layer 550', to form PL contact 348' and WL contact 344' of monocrystalline DFM device 300" shown in FIG. 6, rather than steps 500D through 500J shown in FIGS. 5D through 5J, with conductive layer 522 and second conductive layer 550, to form PL contact 348 and WL contact 344 of monocrystalline DFM device 300' shown in FIG. 4, respectively.

In step 500A, as shown in the example of FIG. 5A, monocrystalline substrate 302' is presented.

In step 500B, as shown in the example of FIG. 5B, monocrystalline pillar 310' is formed from monocrystalline substrate 302'. In some aspects, monocrystalline pillar 310' is formed by forming first, second, third, and/or fourth channel trenches 510, 512, 514, 516 in monocrystalline substrate 302'. For example, first, second, third, and/or fourth channel trenches 510, 512, 514, 516 can be formed by etching, for example, anisotropic etching.

In step 500C, as shown in the example of FIG. 5C, dielectric layer 520 is formed (e.g., deposited) over monocrystalline substrate 302' and monocrystalline pillar 310', surrounding monocrystalline pillar 310'. In some aspects, dielectric layer 520 can be silicon oxide. In some aspects, dielectric layer 520 can include a high-k dielectric, an oxide, a nitride, or a combination thereof.

Figure 7A:
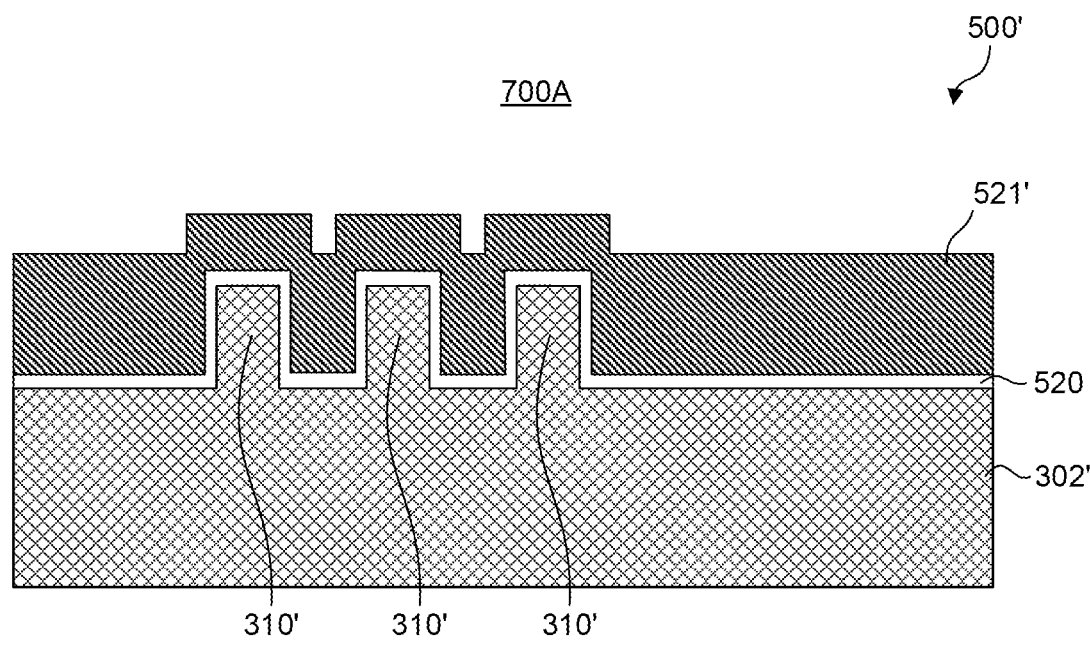
FIGS. 7A through 7I illustrate a manufacturing method for forming the monocrystalline DFM device shown in FIG. 6, according to exemplary aspects.

In step 700A, as shown in the example of FIG. 7A, first removable dielectric layer 521' is formed (e.g., deposited) over dielectric layer 520. In some aspects, first removable dielectric layer 521' can be silicon nitride.

Figure 7B:
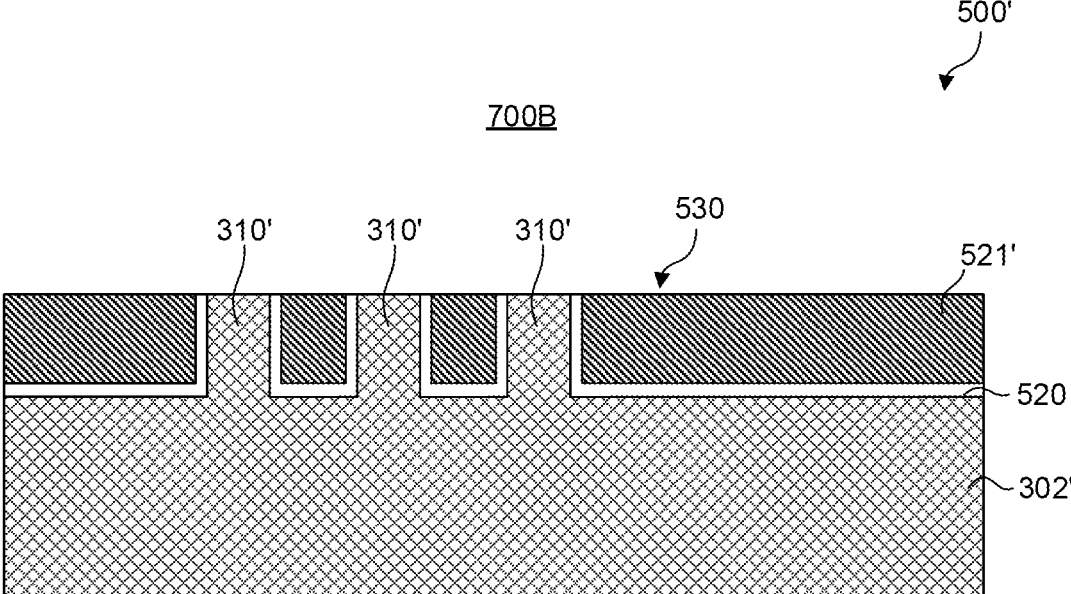

In step 700B, as shown in the example of FIG. 7B, monocrystalline pillar 310', dielectric layer 520, and first removable dielectric layer 521' are planarized to form planar surface 530. For example, as shown in FIG. 7B, an upper portion of monocrystalline pillar 310', dielectric layer 520, and first removable dielectric layer 521' are removed by planarization such that monocrystalline pillar 310' is exposed. In some aspects, planarizing can include chemical mechanical polishing (CMP).

Figure 7C:
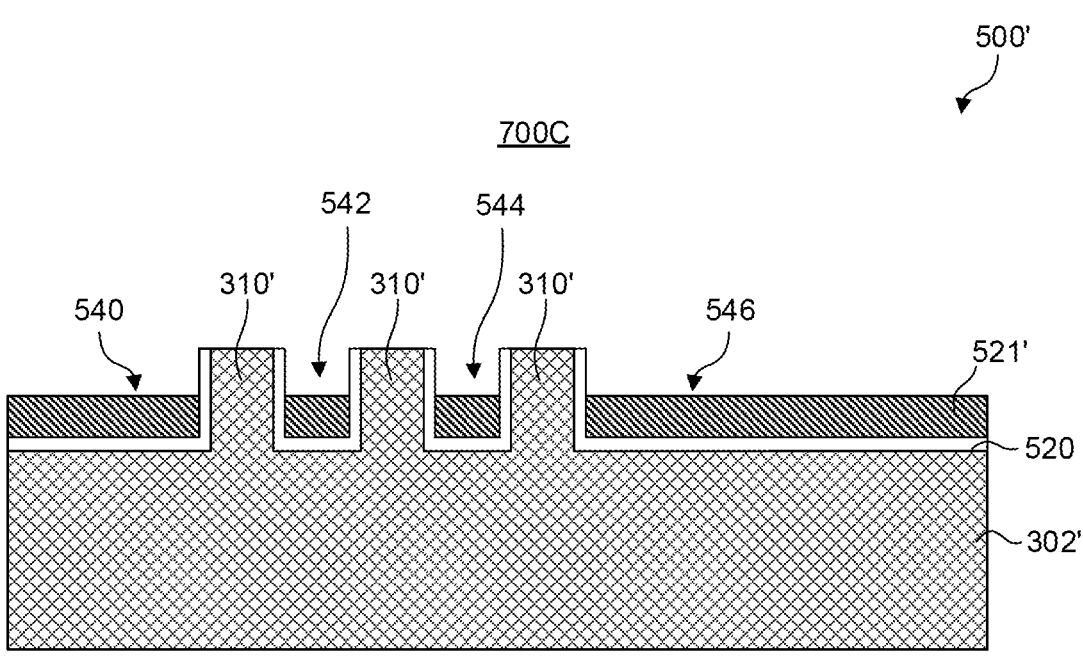

In step 700C, as shown in the example of FIG. 7C, first removable dielectric layer 521' can be recessed relative to monocrystalline pillar 310' and dielectric layer 520. In some aspects, first removable dielectric layer 521' can be recessed by forming first, second, third, and/or fourth PL trenches 540, 542, 544, 546 in first removable dielectric layer 521'. For example, first, second, third, and/or fourth PL trenches 540, 542, 544, 546 can be formed by selective anisotropic etching. In some aspects, first removable dielectric layer 521' can be configured to form a PL contact, for example, PL contact 348' shown in FIG. 6.

Figure 7D:
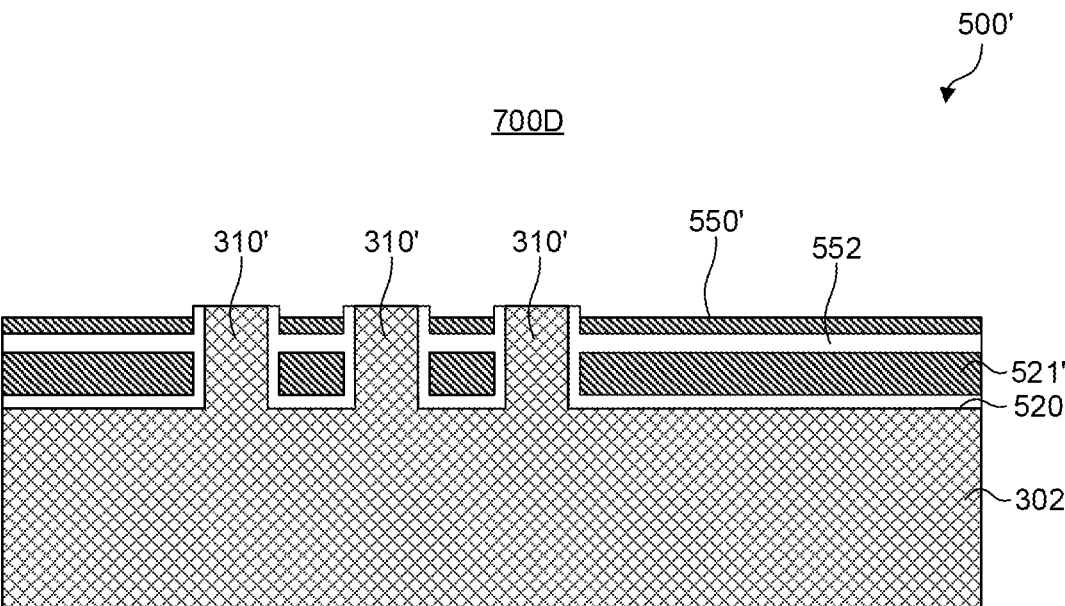

In step 700D, as shown in the example of FIG. 7D, second dielectric layer 552 is formed (e.g., deposited) atop first removable dielectric layer 521' and second removable dielectric layer 550' is formed (e.g., deposited) atop second dielectric layer 552. In some aspects, second removable dielectric layer 550' can be configured to form a WL contact, for example, WL contact 344' shown in FIG. 6. In some aspects, second removable dielectric layer 550' can be silicon nitride. In some aspects, second dielectric layer 552 can be silicon oxide.

Figure 7E:
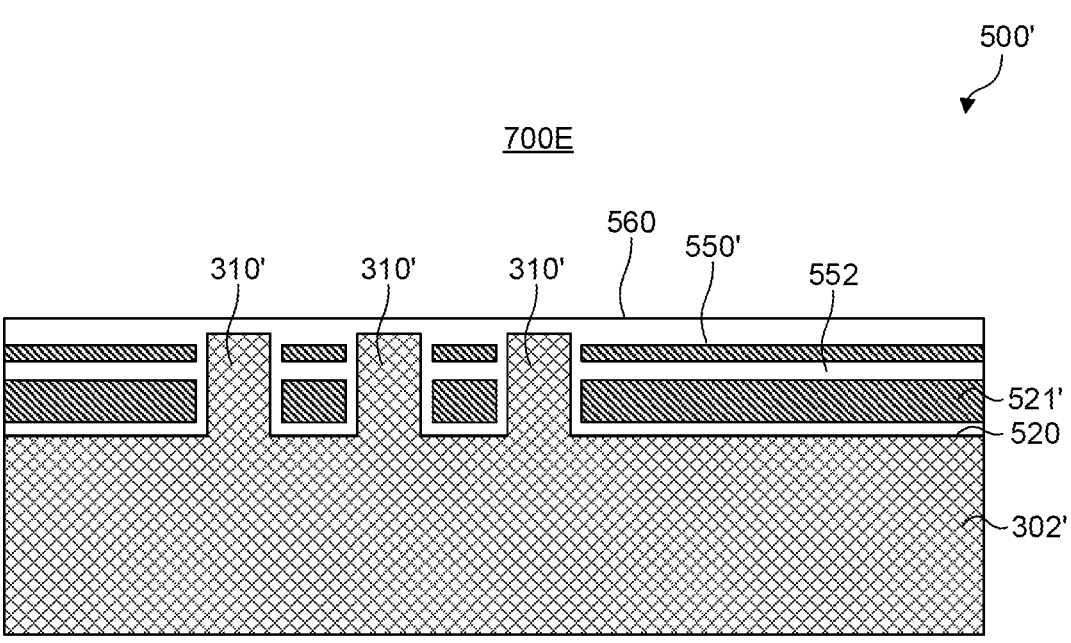

In step 700E, as shown in the example of FIG. 7E, third dielectric layer 560 is deposited atop second removable dielectric layer 550'. In some aspects, third dielectric layer 560 can be configured to form an insulating capping layer. In some aspects, third dielectric layer 560 can be silicon oxide.

Figure 7F:
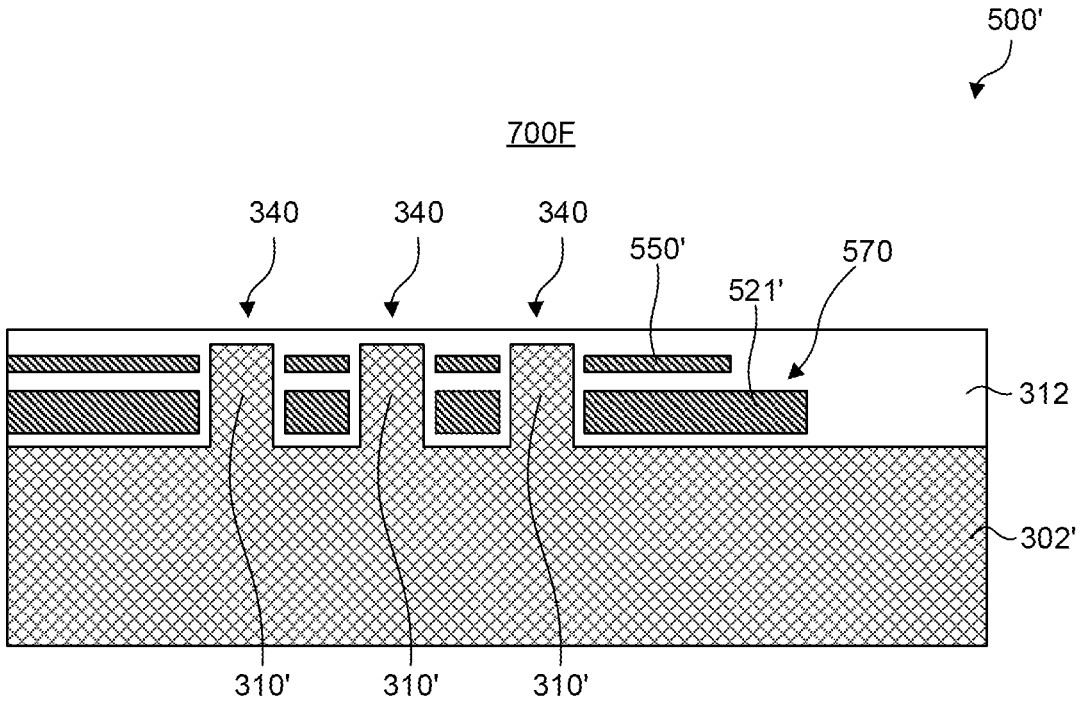

In step 700F, as shown in the example of FIGS. 6 and 7F, staircase structure 570 can be formed in dielectric 312. In some aspects, staircase structure 570 can be formed by etching portions of dielectric layer 520, first removable dielectric layer 521', second dielectric layer 552, second removable dielectric layer 550', and/or third dielectric layer 560 and refilling and/or annealing to form dielectric 312. In some aspects, staircase structure 570 can form WL contact 344' and PL contact 348' of DFM cell 340 as shown in FIG. 6.

Figure 7G:
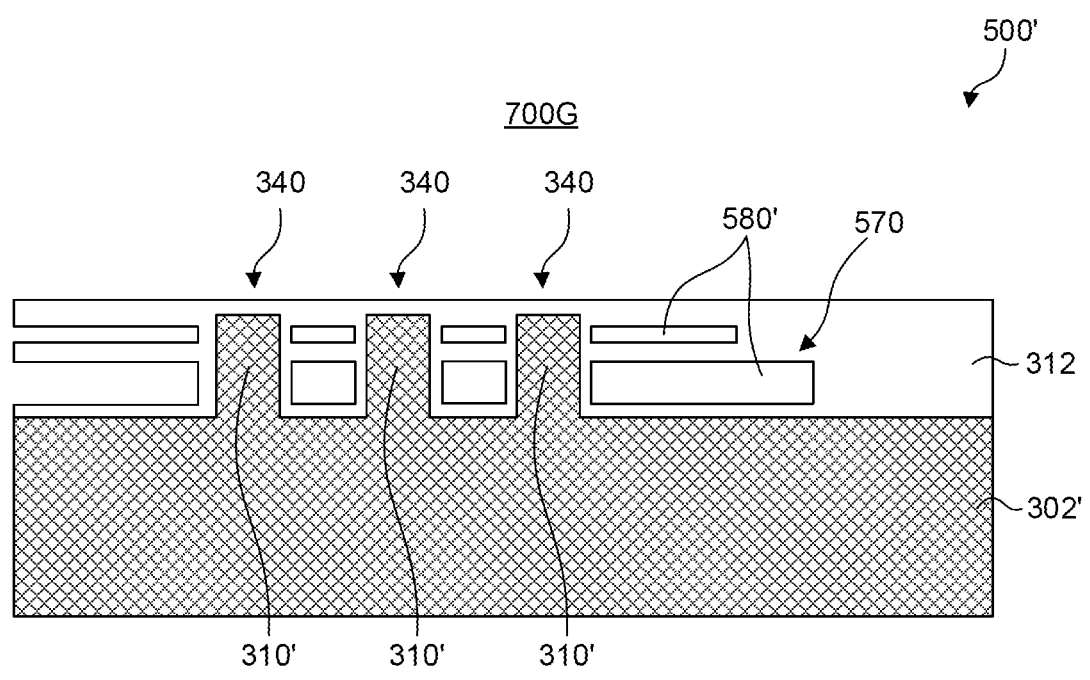

In step 700G, as shown in the example of FIG. 7G, first removable dielectric layer 521' and second removable dielectric layer 550' are removed to form dielectric layer void 580'. In some aspects, first removable dielectric layer 521' and second removable dielectric layer 550' can be removed by etching from a lateral edge of dielectric 312, for example, isotropic etching.

Figure 7H:
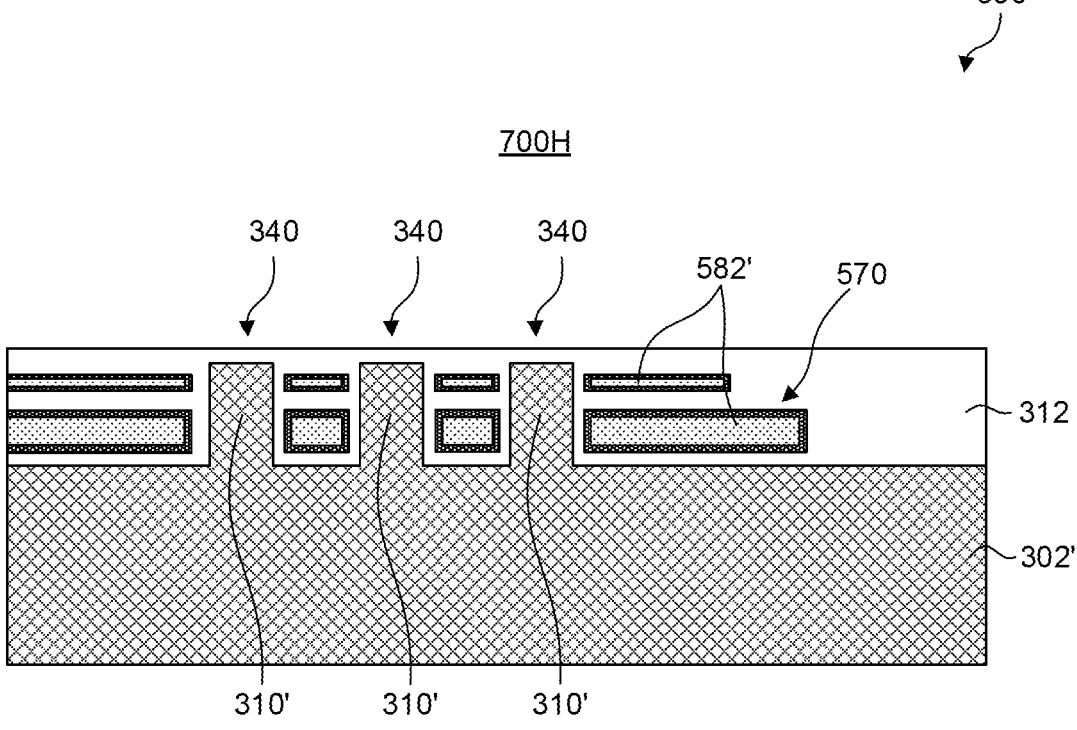

In step 700H, as shown in the example of FIGS. 6 and 7H, refill conductive layers 582' are formed (e.g., deposited) in dielectric layer void 580'. In some aspects, refill conductive layers 582' can include polysilicon, tungsten, aluminum, a metal, or any other conductive material. In some aspects, refill conductive layers 582' can be configured to form a WL contact and a PL contact, for example, WL contact 344' and PL contact 348' shown in FIG. 6.

Figure 7I:
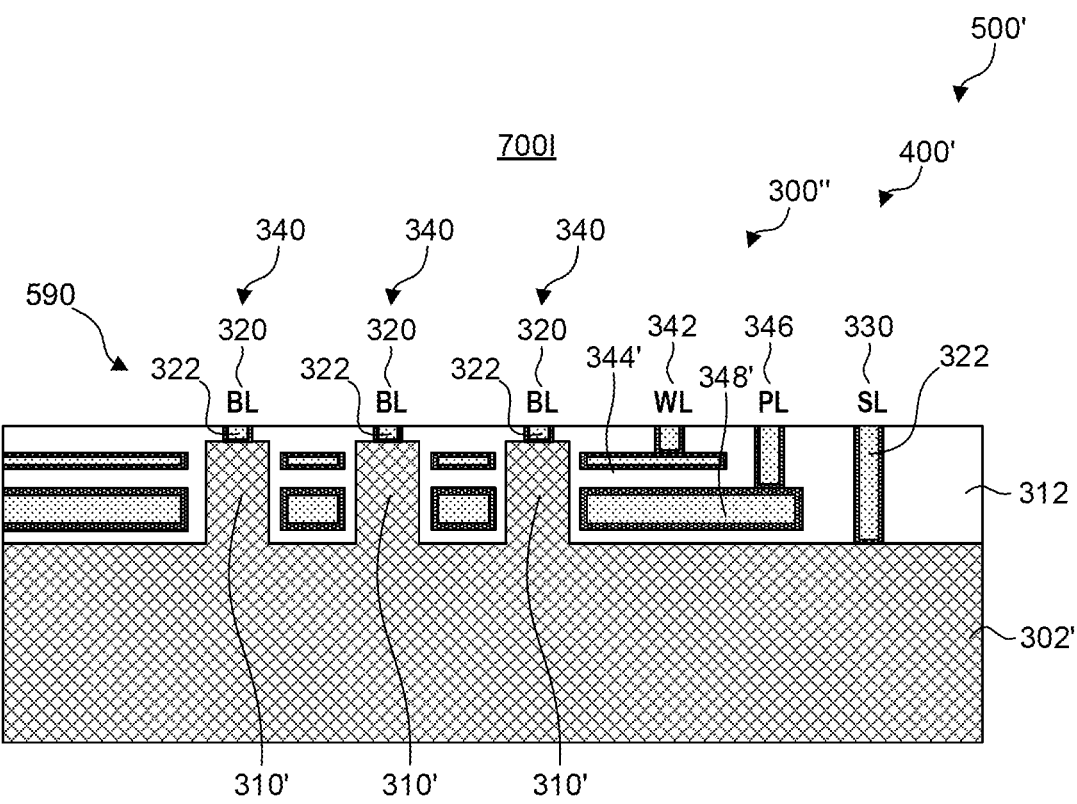

In step 700I, as shown in the example of FIGS. 6 and 7I, interconnects 590 are formed to monocrystalline pillar 310' (e.g., BL 320), WL contact 344' of DFM cell 340 (e.g., WL 342), PL contact 348' of DFM cell 340 (e.g., PL 346), and monocrystalline substrate 302' (e.g., SL 330), respectively, to form one or more monocrystalline DFM devices 300'' shown in FIG. 6. In some aspects, manufacturing method 500' can include forming a DFM device, for example, monocrystalline DFM device 300'' shown in FIG. 6. In some aspects, manufacturing method 500' can include forming a NAND DFM device.

Exemplary Flow Diagrams

FIG. 8 illustrates flow diagram 800 for forming monocrystalline DFM device 300' shown in FIG. 4, according to exemplary aspects. It is to be appreciated that not all steps in FIG. 8 are needed to perform the disclosure provided herein. Further, some of the steps may be performed simultaneously, sequentially, and/or in a different order than shown in FIG. 8. Flow diagram 800 shall be described with reference to FIGS. 4 and 5A through 5J. However, flow diagram 800 is not limited to those example aspects. In some aspects, flow diagram 800 can increase manufacturing efficiency and decrease manufacturing defects, for example, by using a channel first manufacturing scheme with monocrystalline pillar 310' formed directly from monocrystalline substrate 302' to fabricate monocrystalline DFM device 300' shown in FIG. 4.

In step 802, as shown in the example of FIGS. 5A and 5B, monocrystalline pillar 310' is formed from monocrystalline substrate 302'. In some aspects, monocrystalline pillar 310' is formed by forming first, second, third, and/or fourth channel trenches 510, 512, 514, 516 in monocrystalline substrate 302'. For example, first, second, third, and/or fourth channel trenches 510, 512, 514, 516 can be formed by etching, for example, anisotropic etching.

In step 804, as shown in the example of FIG. 5C, dielectric layer 520 is formed (e.g., deposited) over monocrystalline substrate 302' and monocrystalline pillar 310', surrounding monocrystalline pillar 310'. In some aspects, dielectric layer 520 can be silicon oxide. In some aspects, dielectric layer 520 can include a high-k dielectric, an oxide, a nitride, or a combination thereof.

In step 806, as shown in the example of FIGS. 5D and 5E, conductive layer 522 is formed (e.g., deposited) over dielectric layer 520. In some aspects, conductive layer 522 can be polysilicon. In some aspects, conductive layer 522 can include polysilicon, tungsten, aluminum, a metal, or any other conductive material. Further, monocrystalline pillar 310', dielectric layer 520, and conductive layer 522 are planarized to form planar surface 530. In some aspects, planarizing can include CMP.

In step 808, as shown in the example of FIG. 5F, conductive layer 522 can be recessed relative to monocrystalline pillar 310' and dielectric layer 520. In some aspects, conductive layer 522 can be recessed by forming first, second, third, and/or fourth PL trenches 540, 542, 544, 546 in conductive layer 522. For example, first, second, third, and/or fourth PL trenches 540, 542, 544, 546 can be formed by selective anisotropic etching. In some aspects, conductive layer 522 can be configured to form a PL contact, for example, PL contact 348 shown in FIG. 4.

In step 810, as shown in the example of FIG. 5G, second dielectric layer 552 is formed (e.g., deposited) atop conductive layer 522. In some aspects, second dielectric layer 552 can be silicon oxide. In some aspects, second dielectric layer 552 can include a high-k dielectric, an oxide, a nitride, or a combination thereof.

In step 812, as shown in the example of FIG. 5G, second conductive layer 550 is formed (e.g., deposited) atop second dielectric layer 552. In some aspects, second conductive layer 550 can be configured to form a WL contact, for example, WL contact 344 shown in FIG. 4. In some aspects, second conductive layer 550 can include polysilicon, tungsten, aluminum, a metal, or any other conductive material.

In step 814, as shown in the example of FIGS. 4 and 5J, interconnects 590 are formed to monocrystalline pillar 310' (e.g., BL 320), WL contact 344 of DFM cell 340 (e.g., WL 342), PL contact 348 of DFM cell 340 (e.g., PL 346), and monocrystalline substrate 302' (e.g., SL 330), respectively, to form one or more monocrystalline DFM devices 300' shown in FIG. 4. In some aspects, flow diagram 800 can include forming a DFM device, for example, monocrystalline DFM device 300' shown in FIG. 4. In some aspects, flow diagram 800 can include forming a NAND DFM device.

Figure 9:
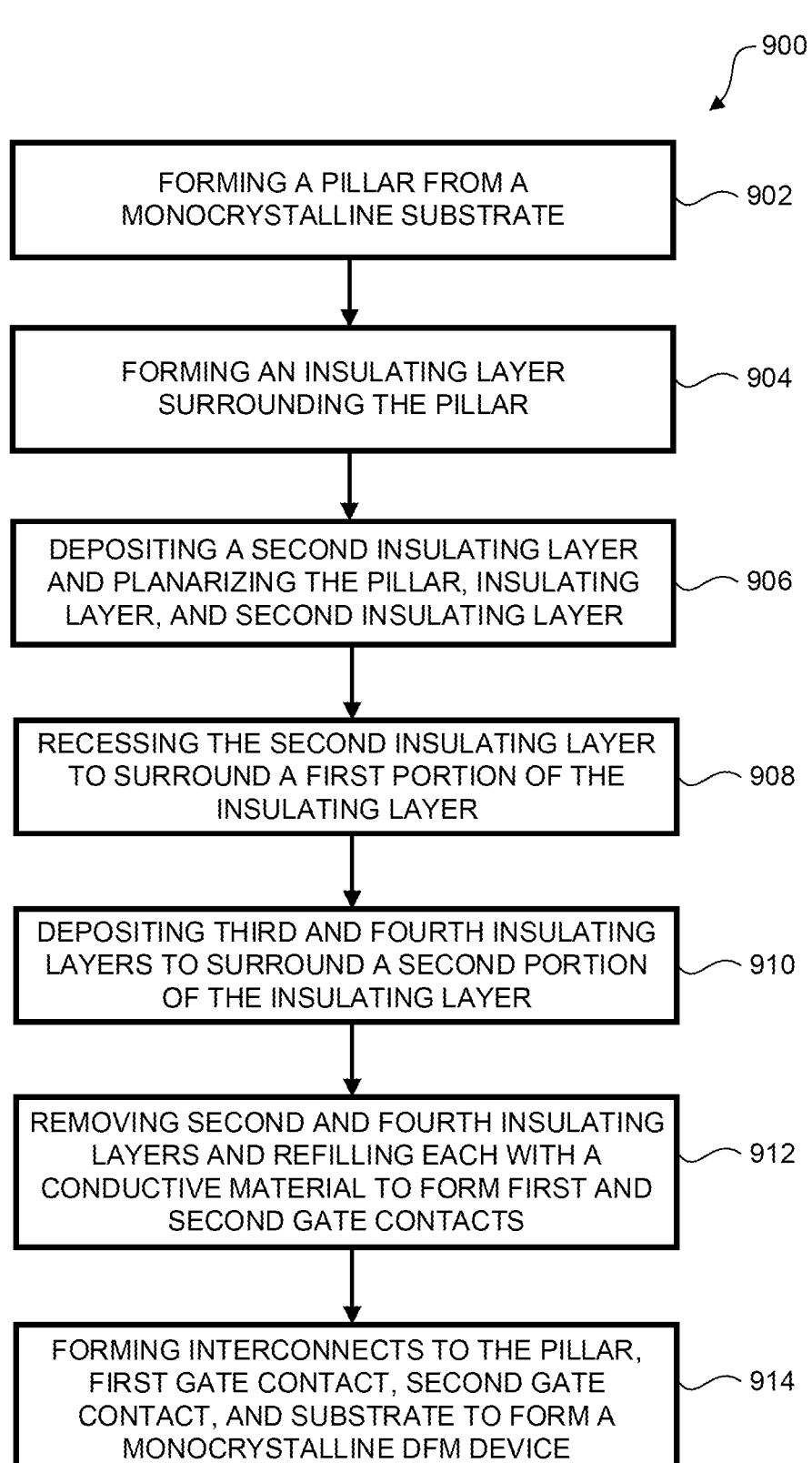
FIG. 9 illustrates a flow diagram for forming the monocrystalline DFM device shown in FIG. 6, according to an exemplary aspect.

FIG. 9 illustrates flow diagram 900 for forming monocrystalline DFM device 300'' shown in FIG. 6, according to exemplary aspects. It is to be appreciated that not all steps in FIG. 9 are needed to perform the disclosure provided herein. Further, some of the steps may be performed simultaneously, sequentially, and/or in a different order than shown in FIG. 9. Flow diagram 900 shall be described with reference to FIGS. 5A, 5B, 5C, 6, and 7A through 7I. However, flow diagram 900 is not limited to those example aspects. In some aspects, flow diagram 900 can increase manufacturing efficiency and decrease manufacturing defects, for example, by using a channel first manufacturing scheme with monocrystalline pillar 310' formed directly from monocrystalline substrate 302' to fabricate monocrystalline DFM device 300'' shown in FIG. 6.

In step 902, as shown in the example of FIGS. 5A and 5B, monocrystalline pillar 310' is formed from monocrystalline substrate 302'. In some aspects, monocrystalline pillar 310' is formed by forming first, second, third, and/or fourth channel trenches 510, 512, 514, 516 in monocrystalline substrate 302'. For example, first, second, third, and/or fourth channel trenches 510, 512, 514, 516 can be formed by etching, for example, anisotropic etching.

In step 904, as shown in the example of FIG. 5C, dielectric layer 520 is formed (e.g., deposited) over monocrystalline substrate 302' and monocrystalline pillar 310', surrounding monocrystalline pillar 310'. In some aspects, dielectric layer 520 can be silicon oxide. In some aspects, dielectric layer 520 can include a high-k dielectric, an oxide, a nitride, or a combination thereof.

In step 906, as shown in the example of FIGS. 7A and 7B, first removable dielectric layer 521' is formed (e.g., deposited) over dielectric layer 520. In some aspects, first removable dielectric layer 521' can be silicon nitride. Further, monocrystalline pillar 310', dielectric layer 520, and first removable dielectric layer 521' are planarized to form planar surface 530. In some aspects, planarizing can include CMP.

In step 908, as shown in the example of FIG. 7C, first removable dielectric layer 521' can be recessed relative to monocrystalline pillar 310' and dielectric layer 520. In some aspects, first removable dielectric layer 521' can be recessed by forming first, second, third, and/or fourth PL trenches 540, 542, 544, 546 in first removable dielectric layer 521'. For example, first, second, third, and/or fourth PL trenches 540, 542, 544, 546 can be formed by selective anisotropic etching. In some aspects, first removable dielectric layer 521' can be configured to form a PL contact, for example, PL contact 348' shown in FIG. 6.

In step 910, as shown in the example of FIG. 7D, second dielectric layer 552 is formed (e.g., deposited) atop first removable dielectric layer 521' and second removable dielectric layer 550' is formed (e.g., deposited) atop second dielectric layer 552. In some aspects, second removable dielectric layer 550' can be configured to form a WL contact, for example, WL contact 344' shown in FIG. 6. In some aspects, second removable dielectric layer 550' can be silicon nitride. In some aspects, second dielectric layer 552 can be silicon oxide.

In step 912, as shown in the example of FIG. 7G, first removable dielectric layer 521' and second removable dielectric layer 550' are removed to form dielectric layer void 580'. In some aspects, first removable dielectric layer 521' and second removable dielectric layer 550' can be removed by etching from a lateral edge of dielectric 312, for example, isotropic etching.

In step 914, as shown in the example of FIGS. 6 and 7I, interconnects 590 are formed to monocrystalline pillar 310' (e.g., BL 320), WL contact 344' of DFM cell 340 (e.g., WL 342), PL contact 348' of DFM cell 340 (e.g., PL 346), and monocrystalline substrate 302' (e.g., SL 330), respectively, to form one or more monocrystalline DFM devices 300" shown in FIG. 6. In some aspects, flow diagram 900 can include forming a DFM device, for example, monocrystalline DFM device 300" shown in FIG. 6. In some aspects, flow diagram 900 can include forming a NAND DFM device.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself may be patterned and materials added on top of it may also be patterned, or may remain without patterning.

The following examples are illustrative, but not limiting, of the aspects of this disclosure. Other suitable modifications and adaptations of the variety of conditions and parameters normally encountered in the field, and which would be apparent to those skilled in the relevant art(s), are within the spirit and scope of the disclosure.

While specific aspects have been described above, it will be appreciated that the aspects may be practiced otherwise than as described. The description is not intended to limit the scope of the claims.

It is to be appreciated that the Detailed Description section, and not the Summary and Abstract sections, is intended to be used to interpret the claims. The Summary and Abstract sections may set forth one or more but not all exemplary aspects as contemplated by the inventor(s), and thus, are not intended to limit the aspects and the appended claims in any way.

The aspects have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects will so fully reveal the general nature of the aspects that others can, by applying knowledge within the skill of the art, readily modify and/or adapt for various applications such specific aspects, without undue experimentation, without departing from the general concept of the aspects. Therefore, such adaptations and modifications are intended to be within the meaning and range of equivalents of the disclosed aspects, based on the teaching and guidance presented herein.

The breadth and scope of the aspects should not be limited by any of the above-described exemplary aspects, but should be defined only in accordance with the following claims and their equivalents.

What is claimed is:

1. A three-dimensional memory device comprising:
   a memory cell comprising:
      a pillar configured to store an electrical charge, the pillar being a monocrystalline material;
      a monolithic insulating layer surrounding the pillar;
      a first gate contact surrounding a first portion of the monolithic insulating layer, the first gate contact coupled to a word line configured to address and non-destructively read the pillar; and
      a second gate contact surrounding a second portion of the monolithic insulating layer, the second gate contact coupled to a plate line configured to program the pillar and separated from the first gate contact by the monolithic insulating layer;
   a top contact coupled to the memory cell, the top contact coupled to a bit line configured to flow electrical charge through the memory cell; and
   a bottom contact coupled to the memory cell, the bottom contact coupled to a source line configured to flow electrical charge through the memory cell and separated from the second gate contact by the monolithic insulating layer.

2. The three-dimensional memory device of claim 1, wherein a defect concentration in the pillar is decreased in comparison to another pillar that is not monocrystalline.

3. The three-dimensional memory device of claim 1, wherein a leakage current in the pillar is decreased in comparison to another pillar that is not monocrystalline.

4. The three-dimensional memory device of claim 1, wherein a retention capacity for storing an electrical charge in the pillar is greater than about 100 ms.

5. The three-dimensional memory device of claim 1, wherein the three-dimensional memory device comprises a dynamic flash memory (DFM) device.

6. The three-dimensional memory device of claim 1, wherein the three-dimensional memory device is capacitor-free.

7. A method of forming a three-dimensional memory device comprising:

forming a memory cell by:

forming a pillar configured to store an electrical charge, the pillar being formed of a monocrystalline material;

forming a monolithic insulating layer surrounding the pillar;

forming a first gate contact surrounding a first portion of the monolithic insulating layer, the first gate contact coupled to a word line configured to address and non-destructively read the pillar and separated from the first gate contact by the monolithic insulating layer; and forming a second gate contact surrounding a second portion of the monolithic insulating layer, the second gate contact coupled to a plate line configured to program the pillar;

forming a top contact coupled to the memory cell and to a bit line configured to flow electrical charge through the memory cell; and forming a bottom contact coupled to the memory cell and to a source line configured to flow electrical charge through the memory cell and separated from the second gate contact by the monolithic insulating layer.

8. The method of claim 7, wherein a defect concentration in the pillar is decreased in comparison to another pillar that is not monocrystalline.

9. The method of claim 7, wherein a leakage current in the pillar is decreased in comparison to another pillar that is not monocrystalline.

10. The method of claim 7, wherein a retention capacity for storing an electrical charge in the pillar is greater than about 100 ms.

11. The method of claim 7, wherein the three-dimensional memory device comprises a dynamic flash memory (DFM) device.

12. The method of claim 7, wherein the three-dimensional memory device is capacitor-free.

\* \* \* \* \*